United States Patent
Yamazaki et al.

(10) Patent No.: US 9,105,536 B2
(45) Date of Patent: Aug. 11, 2015

(54) SOLID-STATE IMAGING DEVICE FOR ANALOG-TO-DIGITAL CONVERSION

(71) Applicants: OLYMPUS CORPORATION, Tokyo (JP); DENSO CORPORATION, Kariya-shi, Aichi-ken (JP)

(72) Inventors: Susumu Yamazaki, Tokyo (JP); Takamoto Watanabe, Kariya (JP)

(73) Assignees: OLYMPUS CORPORATION, Tokyo (JP); DENSO CORPORATION, Kariya-shi (JP)

( * ) Notice: Subject to any disclaimer, the term of this patent is extended or adjusted under 35 U.S.C. 154(b) by 301 days.

(21) Appl. No.: 13/656,015

(22) Filed: Oct. 19, 2012

(65) Prior Publication Data

US 2013/0140434 A1    Jun. 6, 2013

(30) Foreign Application Priority Data

Oct. 21, 2011  (JP) .................. 2011-231865

(51) Int. Cl.
| | |
|---|---|
| *H01L 27/00* | (2006.01) |
| *H04N 9/64* | (2006.01) |
| *H01L 27/146* | (2006.01) |
| *H04N 5/357* | (2011.01) |
| *H04N 5/374* | (2011.01) |
| *H04N 5/378* | (2011.01) |

(52) U.S. Cl.
CPC ............ *H01L 27/146* (2013.01); *H04N 5/3577* (2013.01); *H04N 5/374* (2013.01); *H04N 5/378* (2013.01)

(58) Field of Classification Search
CPC ..................................................... H04N 5/378
USPC ................................. 250/208.1; 348/241, 245
See application file for complete search history.

(56) References Cited

U.S. PATENT DOCUMENTS

| | | | | |
|---|---|---|---|---|
| 2006/0192864 | A1* | 8/2006 | Mauritzson | 348/241 |
| 2009/0244338 | A1* | 10/2009 | Kume | 348/294 |

FOREIGN PATENT DOCUMENTS

| | | |
|---|---|---|
| JP | 3064644 B2 | 7/2000 |
| JP | 3292182 B2 | 6/2002 |
| JP | 2010-283580 A | 12/2010 |

* cited by examiner

*Primary Examiner* — Thanh Luu
(74) *Attorney, Agent, or Firm* — Westerman, Hattori, Daniels & Adrian, LLP

(57) ABSTRACT

A solid-state imaging device is capable of suppressing as much as possible an increase in power consumption of a low-frequency noise removing process. A pixel unit includes pixels outputting pixel signals corresponding to an amount of incident light and correction pixels outputting correction pixel signals corresponding to a correction reference voltage. An AD conversion circuit includes a delay circuit, to which a plurality of delay elements are connected, and outputs a digital signal corresponding to the number of delay elements through which a pulse signal passes when the pulse signal passes through the number of delay elements corresponding to a level of the pixel signal or the correction pixel signal.

7 Claims, 15 Drawing Sheets

US 9,105,536 B2

SOLID-STATE IMAGING DEVICE FOR ANALOG-TO-DIGITAL CONVERSION

BACKGROUND OF THE INVENTION

1. Field of the Invention

The present invention relates to a solid-state imaging device that performs analog-to-digital (hereinafter referred to as "AD") conversion to convert an analog voltage signal output from a pixel into binary digital data.

Priority is claimed on Japanese Patent Application No. 2011-231865, filed Oct. 21, 2011, the content of which is incorporated herein by reference.

2. Description of Related Art

In recent years, imaging devices, such as digital still cameras or digital video cameras, that can acquire images captured using solid-state imaging devices (hereinafter referred to as "image sensors") as digital data and store or edit the digital data have been widely spread. As image sensors used in such imaging devices, charge coupled device (CCD)-type image sensors have most generally been widely used. However, in recent years, since there are demands for further miniaturization and further low power consumption of the image sensors, complementary metal oxide semiconductor (CMOS) type image sensors have been popularized and spread. With miniaturization and low power consumption of imaging devices, miniaturization and low power consumption of AD conversion circuits used in image sensors have been achieved, and an AD conversion circuit has been suggested (for example, see Japanese Patent No. 3064644).

FIG. 15 is a diagram illustrating the configuration of an AD conversion circuit according to the related art. The AD conversion circuit shown in FIG. 15 includes a pulse phase difference encoding circuit 2 that encodes a phase difference between pulse signals PA and PB and a control circuit 4 that generates the pulse signals PA and PB. The pulse phase difference encoding circuit 2 includes a pulse circling circuit 10 (delay circuit), a counter 12, a latch circuit 14, a pulse selector 16, an encoder 18, and a signal processing circuit 19.

The pulse circling circuit 10 has a configuration in which inverting circuits (delay elements: one negative AND circuit NAND and a plurality of (even) inverters INV) receiving a pulse signal PA from one input end to operate are connected in a ring (circular) shape and an analog signal Vin, which is an input signal, is applied as a supply voltage of each inverting circuit. The counter 12 counts the number of times the pulse signal is circled within the pulse circling circuit 10 based on transition of the logic state of a signal output from the last inverter INV (the inverter INV installed at the previous stage of the negative AND circuit NAND) of the last stage of the pulse circling circuit 10 and generates binary digital data.

The latch circuit 14 latches the digital data output from the counter 12. The pulse selector 16 acquires the signal output from each converting circuit of the pulse circling circuit 10 and outputs a signal indicating the position of the pulse signal circling within the pulse circling circuit 10 based on the logic state of the signal output from each converting circuit. The encoder 18 encodes the signal output from the pulse selector 16 to generate digital data based on the circling position of the pulse signal.

The signal processing circuit 19 generates binary digital data DO1 indicating the phase difference between the pulse signals PA and PB by setting the digital data output from the latch circuit 14 and the digital data output from the encoder 18 to high-order bits and low-order bits, respectively, and reducing the data of the high-order bits from the data of the low-order bits. The digital data DO1 generated by the signal processing circuit 19 is output to the outside via a data output line 20.

The AD conversion circuit counts the number of times the pulse signal is circled in the pulse circling circuit 10 within a period (hereinafter referred to as a "sampling period") in which the AD conversion is performed based on the fact that a delay time given to the pulse signal by each inverting circuit is changed by the supply voltage. Further, the AD conversion circuit uses the counted count value and the value obtained by encoding the logic state of the signal output from each inverting circuit in the pulse circling circuit 10 as high-order bits and low-order bits, respectively, to synthesize the output values of the high-order bits and the low-order bits. Since the delay time given to the pulse signal by each inverting circuit is changed by the supply voltage, the number of inverting circuits through which the pulse signal passes within a predetermined period is the number corresponding to the level of a pixel signal, and thus the digital data corresponding to this number is generated.

A CMOS type image sensor (CMOS type image sensor of a column ADC system) in which the AD conversion circuit is provided in each column and a signal output from each pixel is subjected to AD conversion has been suggested (for example, see Japanese Unexamined Patent Application, First Publication No. 2010-283580). In the CMOS type image sensor of the column ADC system, a variation in the gain or offset component between the AD conversion circuits in the columns is corrected. Accordingly, a variation in the gain or offset component between the columns generally needs to be corrected based on the AD conversion result of a signal serving as a reference.

In the CMOS type image sensor of the column ADC system including the above-described AD conversion circuits, however, interference of electromagnetic noise between the adjacent columns or phase noise of the pulse circling circuit itself occurs, since the pulse circling circuits which are oscillation circuits are installed to be adjacent to each other at an interval of a pixel pitch. Since the output state of the inverting circuit is changed between H (High) and L (Low) due to the circling of the pulse in the pulse circling circuit, the supply voltage or a GND voltage of the inverting circuit fluctuates, the delay time of the pulse in the inverting circuit fluctuates due to the fluctuation thereof, and noise is superimposed on the AD conversion result. This noise is the phase noise of the pulse circling circuit itself. A vertical stripe may occur for a column in which the offset component may not be corrected on an image and the variation in the offset component between the columns may not be corrected due to the fact that such noise is superimposed as low-frequency noise on the AD conversion result.

Japanese Patent No. 03292182 discloses a method of removing a low-frequency noise superimposed on the AD conversion circuit. In Japanese Patent No. 03292182, the low-frequency noise is removed by calculating a ratio between the AD conversion result of an analog signal and the AD conversion result of a reference voltage used to remove the low-frequency noise.

SUMMARY OF THE INVENTION

According to a first aspect of the present invention, there is provided a solid-state imaging device including: a pixel unit that includes a plurality of pixels outputting pixel signals corresponding to an amount of incident light and a plurality of correction pixels outputting correction pixel signals corresponding to a correction reference voltage and is configured such that the plurality of pixels and the plurality of correction pixels are arranged in a matrix form and output the pixel signals or the correction pixel signals to a plurality of pixel signal output lines arranged in correspondence with columns of the matrix; a vertical scanning unit that selects a row of the matrix and outputs the pixel signals or the correction pixel signals from the pixels or the correction pixels of the selected row to the plurality of pixel signal output lines; a reference voltage generation unit that outputs the correction reference voltage to the plurality of correction pixels; an AD conversion unit that includes a delay circuit, which is connected to one of the plurality of pixel signal output lines and to which a plurality of delay elements are connected, and outputs digital signals corresponding to the number of delay elements through which a pulse signal passes when the pulse signal passes through the number of delay elements corresponding to a level of the pixel signal or the correction pixel signal; a control unit that controls the vertical scanning unit and the AD conversion unit such that AD conversion is performed on the correction pixel signals of one row in correspondence with AD conversion on the pixel signals of m rows (where m is a natural number greater than or equal to 2) within one frame; and a noise removing unit that removes noise from AD conversion results of the pixel signals using AD conversion results of the correction pixel signals.

According to a second aspect of the present invention, there is provided a solid-state imaging device including: a pixel unit that includes a plurality of pixels outputting pixel signals corresponding to an amount of incident light, and is configured such that the plurality of pixels are arranged in a matrix form and output the pixel signals to a plurality of pixel signal output lines arranged in correspondence with columns of the matrix; a vertical scanning unit that selects a row of the matrix and outputs the pixel signals from the pixels of the selected row to the plurality of pixel signal output lines; an AD conversion unit that includes a delay circuit, which is connected to one of the plurality of pixel signal output lines and to which a plurality of delay elements are connected, and outputs a digital signal corresponding to the number of delay elements through which a pulse signal passes when the pulse signal passes through the number of delay elements corresponding to a level of the pixel signal or a correction reference voltage; a selection voltage output unit that switches a connection state between the plurality of pixel signal output lines and the AD conversion unit between a first state in which the plurality of pixel signal output lines are connected to the AD conversion unit and a second state in which the plurality of pixel signal output lines are disconnected from the AD conversion unit, and that outputs the pixel signals to the AD conversion unit in the first state and outputs the correction reference voltage to the AD conversion unit in the second state; a control unit that controls the vertical scanning unit, the AD conversion unit and the selection voltage output unit such that AD conversion is performed on the correction reference voltage of one row in correspondence with AD conversion on the pixel signals of m rows (where m is a natural number greater than or equal to 2) within one frame; and a noise removing unit that removes noise from AD conversion results of the pixel signals using AD conversion result of the correction reference voltage.

According to a third aspect of the present invention, there is provided a solid-state imaging device including: a pixel unit that includes a plurality of pixels outputting pixel signals corresponding to an amount of incident light and a plurality of light-shielding pixels which output correction pixel signals and are light-shielded, and is configured such that the plurality of pixels and the plurality of light-shielding pixels are arranged in a matrix form and output the pixel signals or the correction pixel signals to a plurality of pixel signal output lines arranged in correspondence with columns of the matrix; a vertical scanning unit that selects a row of the matrix and outputs the pixel signals or the correction pixel signals from the pixels or the light-shielding pixels of the selected row to the plurality of pixel signal output lines; an AD conversion unit that includes a delay circuit, which is connected to one of the plurality of pixel signal output lines and to which a plurality of delay elements are connected, and outputs a digital signal corresponding to the number of delay elements through which a pulse signal passes when the pulse signal passes through the number of delay elements corresponding to a level of the pixel signal or the correction pixel signal; a control unit that controls the vertical scanning unit and the AD conversion unit such that AD conversion is performed on the correction pixel signals of one row in correspondence with AD conversion on the pixel signals of m rows (where m is a natural number greater than or equal to 2) within one frame; and a noise removing unit that removes noise from AD conversion results of the pixel signals using AD conversion results of the correction pixel signals.

According to a fourth aspect of the present invention, in the solid-state imaging device described in any one of the first to third aspects of the present invention, using the AD conversion results of the correction pixel signals of one row, the noise removing unit may remove noise from the pixel signals of an $R^{oth}$ row (where r is a natural number) on which the AD conversion is performed immediately before the AD conversion is performed on the correction pixel signals of the one row and the pixel signals of an s row (where s is a natural number and r+s=m) on which the AD conversion is performed immediately after the AD conversion is performed on the correction pixel signal of the one row.

According to a fifth aspect of the present invention, in the solid-state imaging device described in the second aspect of the present invention, using the AD conversion results of the correction pixel signals of one row, the noise removing unit may remove noise from the pixel signals of an r row (where r is a natural number) on which the AD conversion is performed immediately before the AD conversion is performed on the correction pixel signals of the one row and the pixel signals of an s row (where s is a natural number and r+s=m) on which the AD conversion is performed immediately after the AD conversion is performed on the correction pixel signal of the one row.

According to a sixth aspect of the present invention, in the solid-state imaging device described in any one of the first to third aspects of the present invention, the control unit may control the vertical scanning unit and the AD conversion unit such that m=j (where j is a natural number greater than or equal to 2) when a length of an AD conversion period of the AD conversion unit is p, and m=i (where i is a natural number greater than or equal to 2) when the length of the AD conversion period of the AD conversion unit is q. When p is greater than q, i may be greater than j. When p may be less than q, i is less than j.

According to a seventh aspect of the present invention, in the solid-state imaging device described in the second aspect of the present invention, the control unit may control the vertical scanning unit and the AD conversion unit such that m=j (where j is a natural number greater than or equal to 2) when a length of an AD conversion period of the AD conversion unit is p, and m=i (where i is a natural number greater than or equal to 2) when the length of the AD conversion period of the AD conversion unit is q. When p is greater than q, i may be greater than j. When p is less than q, i may be less than j.

According to an eighth aspect of the present invention, in the solid-state imaging device described in any one of the first to third aspects of the present invention, the plurality of pixel signal output lines may include first and second pixel signal output lines, m may be equal to k (where k is a natural number greater than or equal to 2) in the AD conversion unit connected to the first pixel signal output line, m may be equal to l (where l is a natural number greater than or equal to 2) in the AD conversion unit connected to the second pixel signal output line, and k may be different from l.

According to a ninth aspect of the present invention, the solid-state imaging device described in any one of the first to third aspects of the present invention may further include a comparison unit that compares an amount of each signal input to the AD conversion unit to an amount of a threshold reference voltage and outputs the comparison result to the control unit. Based on the comparison result, the control unit may control the vertical scanning unit and the AD conversion unit such that m=j (where j is a natural number greater than or equal to 2) when the amount of the signal input to the AD conversion unit is greater than the amount of the threshold reference voltage, and m=i (where i is a natural number greater than or equal to 2) when the amount of the signal input to the AD conversion unit is less than the amount of the threshold reference voltage, and i may be greater than j.

According to a tenth aspect of the present invention, the solid-state imaging device described in the second aspect of the present invention may further include a comparison unit that compares an amount of each signal input to the AD conversion unit to an amount of a threshold reference voltage and outputs the comparison result to the control unit. Based on the comparison result, the control unit may control the vertical scanning unit and the AD conversion unit such that m=j (where j is a natural number greater than or equal to 2) when the amount of the signal input to the AD conversion unit is greater than the amount of the threshold reference voltage, and m=i (where i is a natural number greater than or equal to 2) when the amount of the signal input to the AD conversion unit is less than the amount of the threshold reference voltage, and i may be greater than j.

According to an eleventh aspect of the present invention, the solid-state imaging device described in any one of the first to third aspects of the present invention may further include a comparison unit that compares an amount of each signal input to the AD conversion unit to an amount of a threshold reference voltage and outputs the comparison result to the control unit. The control unit may control the vertical scanning unit and the AD conversion unit such that m=j (where j is a natural number greater than or equal to 2) in a predetermined column and right and left columns of the predetermined column when the amount of the signal input to the AD conversion unit of the predetermined column is greater than the amount of the threshold reference voltage, and m=i (where i is a natural number greater than or equal to 2) in the predetermined column and right and left columns of the predetermined column when the amount of the signal input to the AD conversion unit of the predetermined column is less than the amount of the threshold reference voltage, and i may be greater than j.

According to a twelfth aspect of the present invention, the solid-state imaging device described in the second aspect of the present invention may further include a comparison unit that compares an amount of each signal input to the AD conversion unit to an amount of a threshold reference voltage and outputs the comparison result to the control unit. The control unit may control the vertical scanning unit and the AD conversion unit such that m=j (where j is a natural number greater than or equal to 2) in a predetermined column and right and left columns of the predetermined column when the amount of the signal input to the AD conversion unit of the predetermined column is greater than the amount of the threshold reference voltage, and m=i (where i is a natural number greater than or equal to 2) in the predetermined column and right and left columns of the predetermined column when the amount of the signal input to the AD conversion unit of the predetermined column is less than the amount of the threshold reference voltage, and i may be greater than j.

According to a thirteenth aspect of the present invention, the solid-state imaging device described in any one of the first to third aspects of the present invention may further include an operation mode setting unit that outputs a signal corresponding to an operation mode to the control unit. The control unit may control the vertical scanning unit and the AD conversion unit such that m is changed based on the signal output from the operation mode setting unit.

According to a fourteenth aspect of the present invention, the solid-state imaging device described in the second aspect of the present invention may further include an operation mode setting unit that outputs a signal corresponding to an operation mode to the control unit. The control unit may control the vertical scanning unit and the AD conversion unit such that m is changed based on the signal output from the operation mode setting unit.

DETAILED DESCRIPTION OF THE INVENTION

Hereinafter, embodiments of the present invention will be described with reference to the drawings. To facilitate the description in each embodiment of the present invention, only the detailed configuration and operation of a solid-state imaging device will be described. Since the detailed configuration and operation of an AD conversion circuit and a photographing operation of the solid-state imaging device are the same as those of the AD conversion circuit and the solid-state imaging device according to the related art, the description thereof will not be repeated.

First Embodiment

Figure 1:
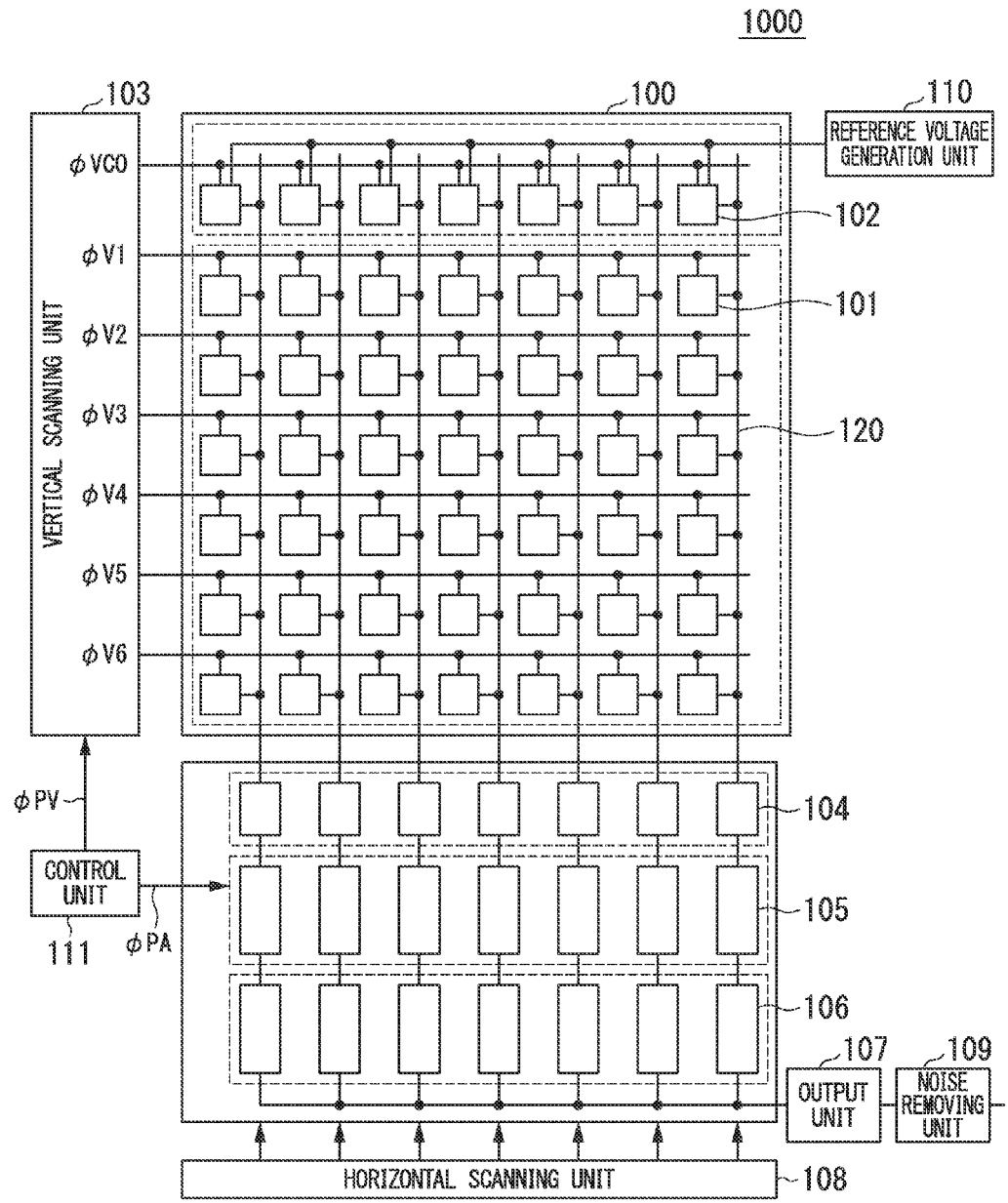
FIG. 1 is a block diagram illustrating the configuration of a solid-state imaging device according to a first embodiment of the present invention.

First, a first embodiment of the present invention will be described. FIG. 1 is a diagram illustrating the configuration of a solid-state imaging device 1000 according to this embodiment. Hereinafter, the units shown in FIG. 1 will be described. The solid-state imaging device 1000 includes a pixel unit 100, a vertical scanning unit 103, an analog signal processing unit 104, an AD conversion circuit 105, a memory unit 106, an output unit 107, a horizontal scanning unit 108, a noise removing unit 109, a reference voltage generation unit 110, and a control unit 111.

The pixel unit 100 includes a plurality of pixels 101 and a plurality of correction pixels 102 arranged in a matrix form. In this embodiment, description will be made using the pixels 101 arranged in seven horizontal columns and six vertical rows. The same applies to embodiments to be described below. In this embodiment, the correction pixels 102 corresponding to one row are arranged.

The pixels 101 generate a pixel signal based on the amount of incident light. A reference voltage Vref (correction reference voltage) is input from the reference voltage generation unit 110 to the correction pixels 102. The correction pixels 102 output a signal (correction pixel signal) based on the reference voltage Vref from the reference voltage generation unit 110 irrespective of the amount of the incident light. Each pixel 101 and each correction pixel 102 are connected to a pixel signal output line 120 arranged in each column (hereinafter referred to as a pixel column) forming a pixel arrangement. A pixel signal generated by each pixel 101 and the signal output from each correction pixel 102 are output to the corresponding pixel signal output line 120.

The vertical scanning unit 103 controls an exposure operation and a signal reading operation of the pixels 101, a signal reading operation of the correction pixels 102, or the like by outputting various control signals to the pixel unit 100. The control of the pixels 101 and the correction pixels 102 is performed in units of rows. That is, when the signal is read from the pixel 101 or the correction pixel 102, the vertical scanning unit 103 selects the row from which the signal is read, outputs the control signal to the pixel 101 or the correction pixel 102 of the selected row, and outputs the signal from the pixel 101 or the correction pixel 102 of the selected row to the pixel signal output line 120.

The analog signal processing unit 104 performs a process such as sample & hold (S/H) on an analog signal output from the pixel unit 100. The AD conversion circuit 105 performs AD conversion on the analog signal processed by the analog signal processing unit 104 to generate digital data. An AD conversion circuit that includes a delay circuit configured such that a plurality of inverting circuits (delay elements) are connected in a ring (circular) shape, an analog signal which is an input signal is applied as a supply voltage of each inverting circuit, and a pulse signal passes through each inverting circuit can be used as the AD conversion circuit 105. Since the delay time given to the pulse signal by each inverting circuit is changed by the supply voltage, the number of inverting circuits through which the pulse signal passes within a predetermined period is the number corresponding to the level of the pixel signal of the pixels 101 or the signal of the correction pixels 102, and the digital data corresponding to this number is generated. The memory unit 106 retains the digital data which is the AD conversion result. The output unit 107 outputs the digital data retained in the memory unit 106 to the noise removing unit 109 at the rear stage.

The horizontal scanning unit 108 controls reading of the digital data from the memory unit 106. The noise removing unit 109 generates a signal obtained by removing low-frequency noise from the AD conversion result of the pixel signal using the AD conversion result of the signal from the correction pixel 102. The reference voltage generation unit 110 generates the reference voltage Vref and outputs the reference voltage Vref to the correction pixel 102. The control unit 111 outputs control signals φPV and φPA to the vertical scanning unit 103 and the AD conversion circuit 105, respectively, and controls the operations of the vertical scanning unit 103 and the AD conversion circuit 105.

The vertical scanning unit 103 performs an operation corresponding to the control signal φPV from the control unit 111 under the control of the control unit 111. The vertical scanning unit 103 generates control signals φVco and φV1 to φV6 based on the control signal φPV. The control signal φVco is output to the correction pixels 102 and the control signals φV1 to φV6 are output to the first to sixth rows of the pixels 101, respectively. While the control signal φVco enters an H (High) state, the correction pixels 102 are selected. While the control signals φV1 to φV6 enter an H (High) state, the pixels 101 of the rows corresponding to the control signals φV1 to φV6 are selected.

The solid-state imaging device 1000 according to this embodiment includes the analog signal processing unit 104, the AD conversion circuit 105, and the memory unit 106 in each pixel column. In each pixel column, an analog signal from the pixel unit 100 is output to the analog signal processing unit 104. The analog signal processing unit 104 processes the analog signal and outputs the processed analog signal to the AD conversion circuit 105. While the control signal φPV from the control unit 111 enters the H (High) state under the control of the control unit 111, the AD conversion circuit 105 performs the AD conversion on the input signal and outputs the digital data after the AD conversion is performed to the memory unit 106.

Figure 2:
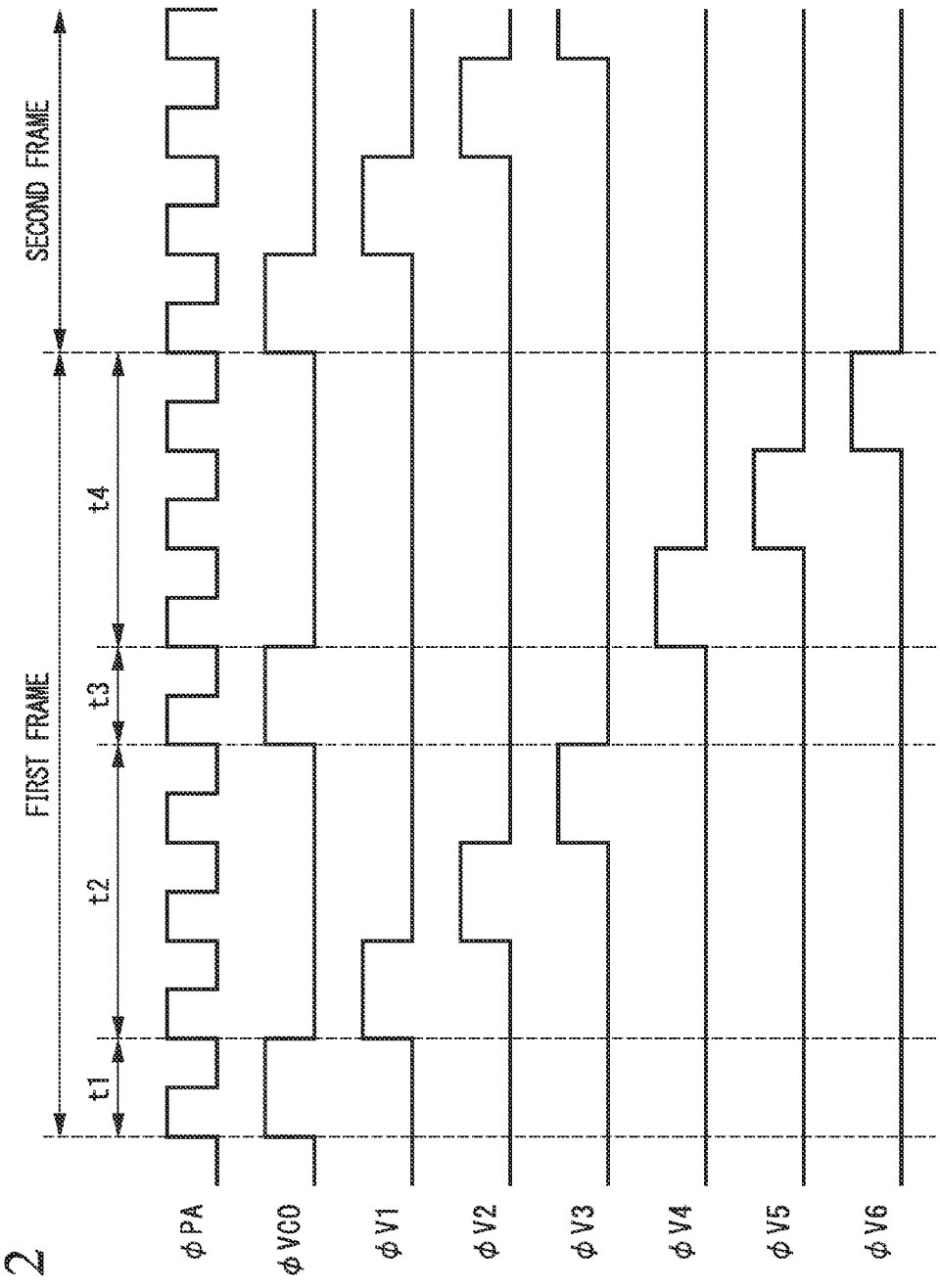
FIG. 2 is a timing chart illustrating an operation of the solid-state imaging device according to the first embodiment of the present invention.

Next, the operation of the solid-state imaging device 1000 with the above-described configuration will be described with reference to FIG. 2. FIG. 2 is a diagram illustrating the operation of the solid-state imaging device 1000. First, during a period t1, the states of the control signals φVco and φPV are changed from the L state to the H state and the AD conversion starts on the signals of the correction pixels 102 to be subjected to the AD conversion. A period in which the control signal φPV is in the H state is a sampling period. After the sampling period ends and the state of the control signal φPV is changed from the H state to the L state, the state of the control signal φVco is changed from the H state to the L state. Thus, the period in which the AD conversion is performed on the signal of the correction pixel 102 ends, an AD conversion result DCO1-1 may be obtained.

Subsequently, during a period t2, the states of the control signals φV1 and φPV are changed from the L state to the H state and the AD conversion starts on the pixel signals of the pixels 101 of the first row to be subjected to the AD conversion. During the sampling period in which the control signal φPV is in the H state, the AD conversion is performed, since the state of the control signal φV1 is changed from the H state to the L state, an AD conversion result DSIG1-1 of the pixel signal of the pixels 101 of the first row may be obtained. Moreover, when the states of the control signal φV2 and the control signal φPV are changed from the L state to the H state and the AD conversion is performed on the pixel signals of the pixels 101 of the second row to be subjected to the AD conversion, an AD conversion result DSIG1-2 can be obtained. Moreover, when the states of the control signal φV3 and the control signal φPV are changed from the L state to the H state and the AD conversion is performed on the pixel signals of the pixels 101 of the third row to be subjected to the AD conversion, an AD conversion result DSIG1-3 can be obtained.

Subsequently, when the AD conversion is performed on the signals of the correction pixels 102 during a time t3 as in the above-described period t1, an AD conversion result DCO1-2 may be obtained. Subsequently, when the AD conversion is performed on the pixel signals of the pixels 101 of the fourth to sixth rows during a period t4 as in the above-described period t2, AD conversion results DSIG1-4 to DSIG1-6 may be obtained.

Figure 3:
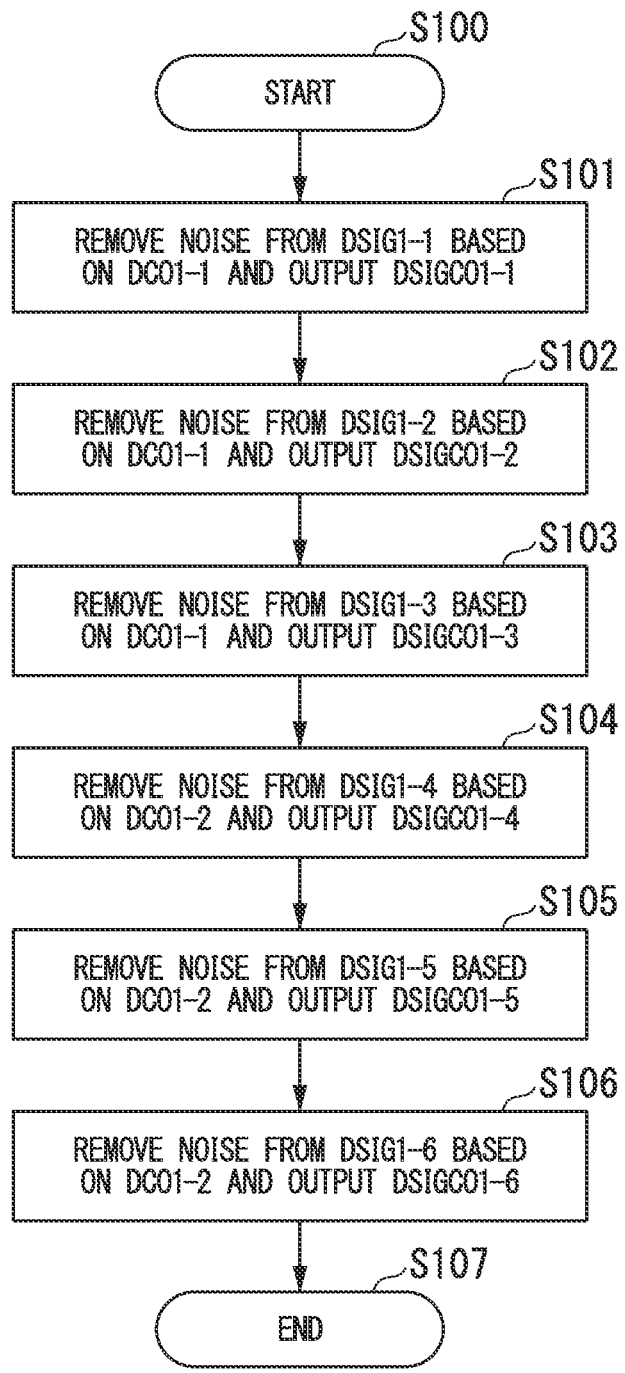
FIG. 3 is a flowchart illustrating an operation of a noise removing unit of the solid-state imaging device according to the first embodiment of the present invention.

Next, the operation of the noise removing unit 109 will be described with reference to FIG. 3. FIG. 3 is a diagram illustrating the order of a low-frequency noise removing process performed by the noise removing unit 109. Hereinafter, a case in which low-frequency noise of the pixel signals DSIG1-1 to DSIG1-6 corresponding to one frame is removed will be exemplified.

When the AD conversion results are obtained, as described above, and the AD conversion results necessary for removing the low-frequency noise are input to the noise removing unit 109, the noise removing unit 109 sequentially starts the process (step S100). The noise removing unit 109 performs the low-frequency noise removing process on the AD conversion result DSIG1-1 of the pixel signals of the pixels 101 of the first row using the AD conversion result DCO1-1 of the signals of the correction pixels 102, and outputs a signal DSIGCO1-1 from which the low-frequency noise is removed (step S101). At this time, for example, a process shown in Equation (1) and Equation (2) below may be used in the low-frequency noise removing process performed by the noise removing unit 109.

[Expression 1]

$$DSIGCO1 = DSIG1 - DCO1 + DOFF \quad (1)$$

$$DSIGCO1 = \frac{DSIG1}{DCO1} \times DOFF \quad (2)$$

Equation (1) and Equation (2) show the process of obtaining signals DSIGCO1 (corresponding to DSIGCO1-1 to DSIGCO1-6) by performing the low-frequency noise removing process on the AD conversion results DSIG1 (corresponding to DSIG1-1 to DSIG1-6) of the pixel signals of the pixels 101 using the AD conversion results DCO1 (corresponding to DCO1-1 and DCO1-2) of the signals of the correction pixels 102. In the equations, DOFF indicates an offset value used to set the calculation result to have a positive value (□0). The low-frequency noise removing process may be a process other than the process using Equation (1) and Equation (2) above and may be a process of removing the low-frequency noise from the AD conversion results of the pixel signals of the pixels 101 using the AD conversion results of the signals of the correction pixels 102.

Subsequently, the noise removing unit 109 performs the low-frequency noise removing process on the AD conversion result DSIG1-2 of the pixel signals of the pixels 101 of the second row using the AD conversion result DCO1-1 of the signals of the correction pixels 102, and then outputs the signal DSIGCO1-2 from which the low-frequency noise is removed (step S102). Subsequently, the noise removing unit 109 performs the low-frequency noise removing process on the AD conversion result DSIG1-3 of the pixel signals of the pixels 101 of the third row using the AD conversion result DCO1-1 of the signals of the correction pixels 102, and then outputs the signal DSIGCO1-3 from which the low-frequency noise is removed (step S103).

Likewise, the noise removing unit 109 performs the low-frequency noise removing process sequentially on the AD conversion result DSIG1-4 of the pixel signals of the pixels 101 of the fourth row, the AD conversion result DSIG1-5 of the pixel signals of the pixels 101 of the fifth row, and the AD conversion result DSIG1-6 of the pixel signals of the pixels 101 of the sixth row based on the AD conversion result DCO1-2 of the signals of the correction pixels 102, and then outputs the signals DSIGCO1-4, DSIGCO1-5 and DSIGCO1-6 from which the low-frequency noise is removed (step S104 to step S106). When the low-frequency noise removing process of the pixel signals of the pixels 101 of all the rows ends, the noise removing unit 109 ends the process (step S107).

As shown in FIGS. 2 and 3, the AD conversion is performed on the pixel signals of the pixels 101 of three rows in correspondence with the AD conversion on the signals of the correction pixels 102 of one row, and the low-frequency noise removing process is performed on the AD conversion results of the pixel signals of the pixels 101 of three rows using the AD conversion results of the signals of the correction pixels 102 of one row. To perform such control, the control unit 111 controls the signal reading operation of the vertical scanning unit 103 and the AD conversion operation of the AD conversion circuit 105 such that the AD conversion including the AD conversion on the signals of the correction pixel 102 of one row and the AD conversion on the pixel signals of the pixels 101 of three rows is repeatedly performed.

As described above, the solid-state imaging device 1000 according to this embodiment performs the AD conversion on the signals of the correction pixels 102 of one row to remove the low-frequency noise in correspondence with the AD conversion on the pixel signals of the pixels 101 of the plurality of rows (in this embodiment, three rows) and performs the low-frequency noise removing process on the AD conversion results of the pixel signals of the pixels 101 of the plurality of rows based on the AD conversion results of the signals of the correction pixels 102 of one row. Therefore, an increase in the power consumption of the low-frequency noise removing process can be suppressed as much as possible, compared to a case in which the AD conversion is performed on the signals of the correction pixels of one row whenever the AD conversion is performed on the pixel signals of one row.

In this embodiment, the AD conversion on the signals of the correction pixels 102 of one row is performed to remove the low-frequency noise in correspondence with the AD conversion on the pixel signals of the pixels 101 of the three rows, but the present invention is not limited thereto. The influence of the low-frequency noise may be confirmed in advance and the AD conversion may be performed an optimum number of times in accordance with the degree of influence of the low-frequency noise. In this embodiment, the case in which the number of rows of the correction pixels 102 is one has been described. However, even when the number of rows of the correction pixels 102 is two or more, the same advantage may be obtained.

Second Embodiment

Figure 4:
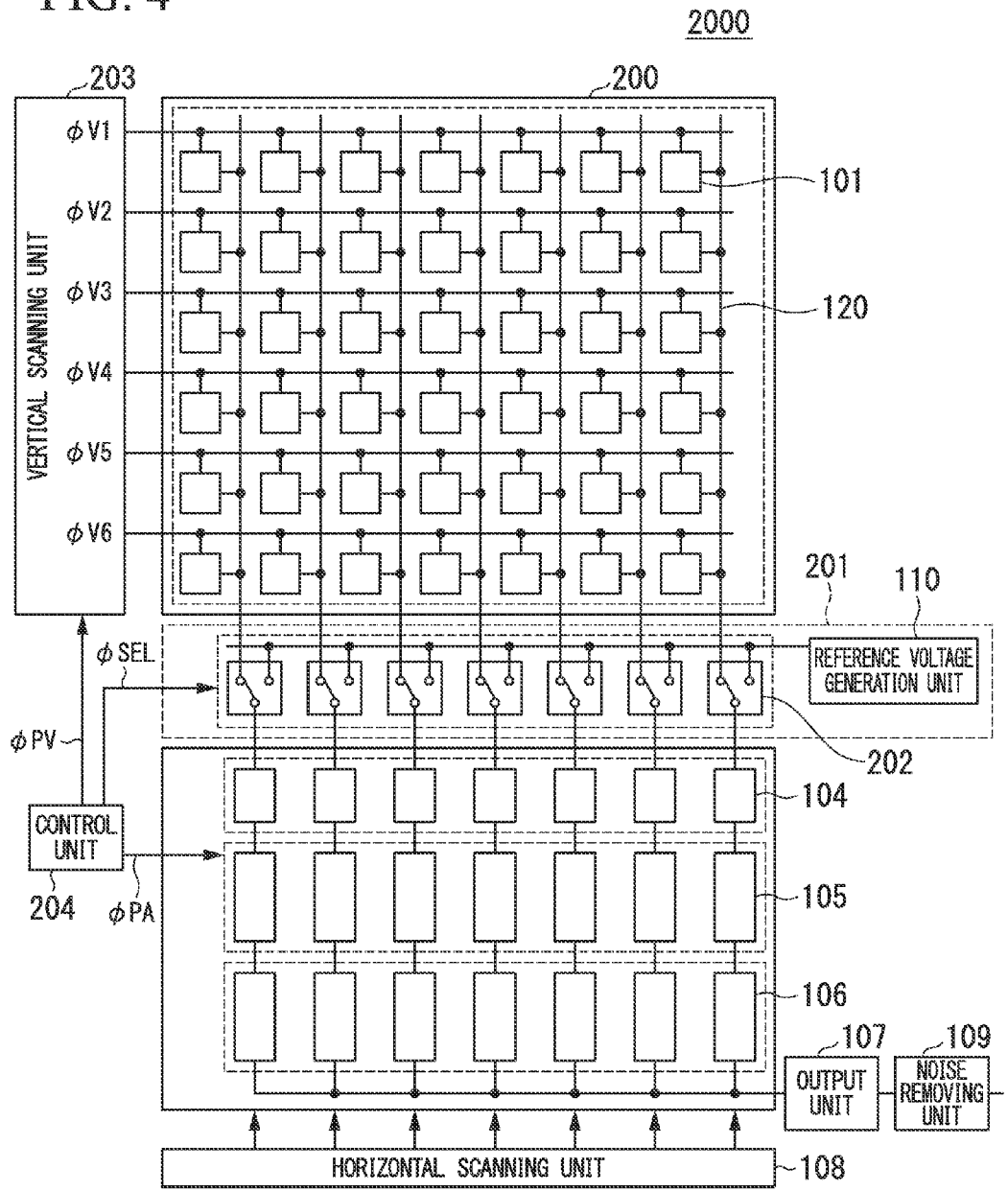
FIG. 4 is a block diagram illustrating the configuration of a solid-state imaging device according to a second embodiment of the present invention.

Next, a second embodiment of the present invention will be described. FIG. 4 is a diagram illustrating the configuration of a solid-state imaging device 2000 according to this embodiment. The same reference numerals are given to constituent elements in FIG. 4 having the same configuration as those in FIG. 1, and the description thereof will not be repeated. Hereinafter, the configuration and operation of the solid-state imaging device according to this embodiment will be described focusing on differences between this embodiment and the first embodiment.

A difference between this embodiment and the first embodiment is that the pixel unit 100 is substituted with a pixel unit 200, the vertical scanning unit 103 is substituted with a vertical scanning unit 203, the control unit 111 is substituted with a control unit 204, a selection voltage output unit 201 is newly provided. The pixel unit 200 includes only a plurality of pixels 101 arranged in a matrix form. The pixels 101 are arranged in seven horizontal columns and six vertical rows. In the vertical scanning unit 203, the function of outputting the control signal φVco is excluded from the functions of the vertical scanning unit 103 described in the first embodiment.

The selection voltage output unit 201 includes the reference voltage generation unit 110 and also includes switches 202 that each has a first input terminal connected to the reference voltage generation unit 110, a second input terminal connected to a pixel signal output line 120, and an output terminal connected to the analog signal processing unit 104. A reference voltage Vref (correction reference voltage) from the reference voltage generation unit 110 is input to the first input terminal of the switch 202, and a pixel signal is input to the second input terminal of the switch 202 via the pixel signal output line 120.

The switch 202 is controlled by a control signal φSEL from the control unit 204. When the control signal φSEL enters an L state, the second input terminal is connected to the output terminal (the first input terminal is disconnected from the output terminal) and the pixel signal is output to the analog signal processing unit 104. When the control signal φSEL enters an H state, the first input terminal is connected to the output terminal (the second input terminal is disconnected from the output terminal) and the reference signal Vref is output to the analog signal processing unit 104. The control unit 204 controls the operations of the vertical scanning unit 103 and the AD conversion circuit 105, as in the first embodiment, and also outputs the control signal φSEL to the selection voltage output unit 201 to control the operation of the selection voltage output unit 201.

Figure 5:
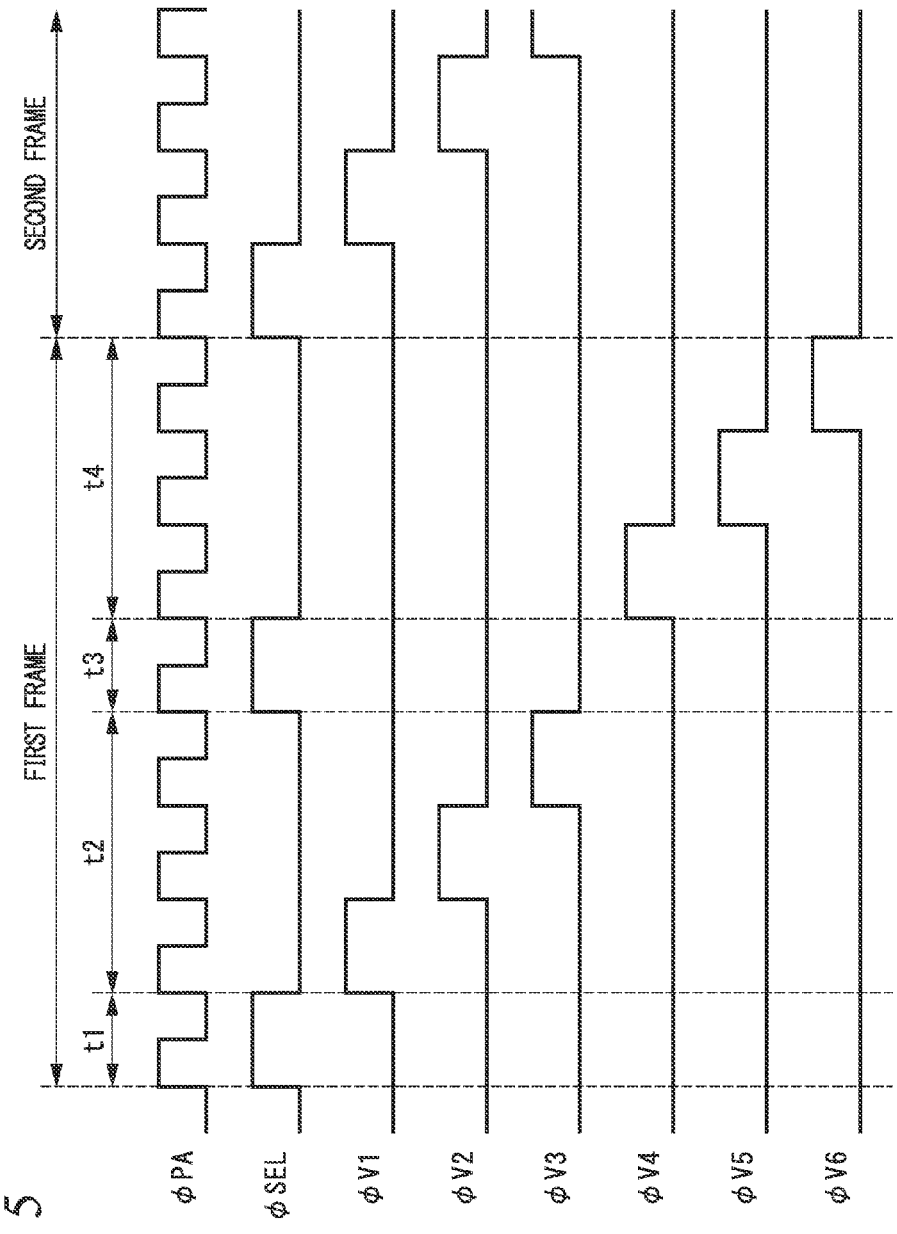
FIG. 5 is a timing chart illustrating an operation of the solid-state imaging device according to the second embodiment of the present invention.

Next, the operation of the solid-state imaging device 2000 with the above-described configuration will be described with reference to FIG. 5. FIG. 5 is a diagram illustrating the operation of the solid-state imaging device 2000. A difference between this embodiment and the first embodiment is that the control signal φVco is substituted with the control signal φSEL. During periods t1 and t3 in which the control signal φSEL is in the H state, the reference voltage Vref is input to the AD conversion circuits 105 via the switches 202 and the analog signal processing units 104 and is subjected to the AD conversion. During periods t2 and t4 in which the control signal φSEL is in the L state, the pixel signals of the pixels 101 of the first to sixth rows are input sequentially to the AD conversion circuits 105 via the switches 202 and the analog signal processing units 104 and are subjected to the AD conversion sequentially. Since the operation performed on the AD conversion results by the low-frequency noise removing unit 109 is the same as the operation (see FIG. 3) described in the first embodiment, the description thereof will not be repeated.

As shown in FIGS. 5 and 3, the AD conversion is performed on the pixel signals of the pixels 101 of three rows in correspondence with the AD conversion on the signals of one row of the reference voltage Vref, and the low-frequency noise removing process is performed on the AD conversion results of the pixel signals of the pixels 101 of three rows using the AD conversion results of the signals of one row of the reference voltage Vref. To perform such control, the control unit 204 controls the signal reading operation of the vertical scanning unit 203, the switching operation of the connection by the switches 202 of the selection voltage output unit 201, and the AD conversion operation of the AD conversion circuit 105 such that the AD conversion including the AD conversion on the signals of one row of the reference voltage Vref and the AD conversion on the pixel signals of the pixels 101 of three rows are repeatedly performed.

As described above, the solid-state imaging device 2000 according to this embodiment performs the AD conversion on the signals of one row of the reference voltage Vref to remove the low-frequency noise in correspondence with the AD conversion on the pixel signals of the pixels 101 of the plurality of rows and performs the low-frequency noise removing process on the AD conversion results of the pixel signals of the pixels 101 of the plurality of rows using the AD conversion results of the signals of one row of the reference voltage Vref. Therefore, an increase in the power consumption of the low-frequency noise removing process may be suppressed as much as possible.

In this embodiment, the AD conversion on the signals of one row of the reference voltage Vref is performed to remove the low-frequency noise in correspondence with the AD conversion on the pixel signals of the pixels 101 of the three rows, but the present invention is not limited thereto. The influence of the low-frequency noise may be confirmed in advance and the AD conversion may be performed an optimum number of times in accordance with the degree of influence of the low-frequency noise.

In this embodiment, the selection voltage output unit 201 is disposed between the pixel unit 200 and the analog signal processing unit 104 and the output voltage Vref of the reference voltage generation unit 110 is input to the AD conversion circuit 105 via the analog signal processing unit 104. However, even when the selection voltage output unit 201 is configured to be disposed between the analog signal processing unit 104 and the AD conversion circuit 105 and the reference voltage Vref is input directly to the AD conversion circuit 105, the same advantage may be obtained.

Third Embodiment

Figure 6:
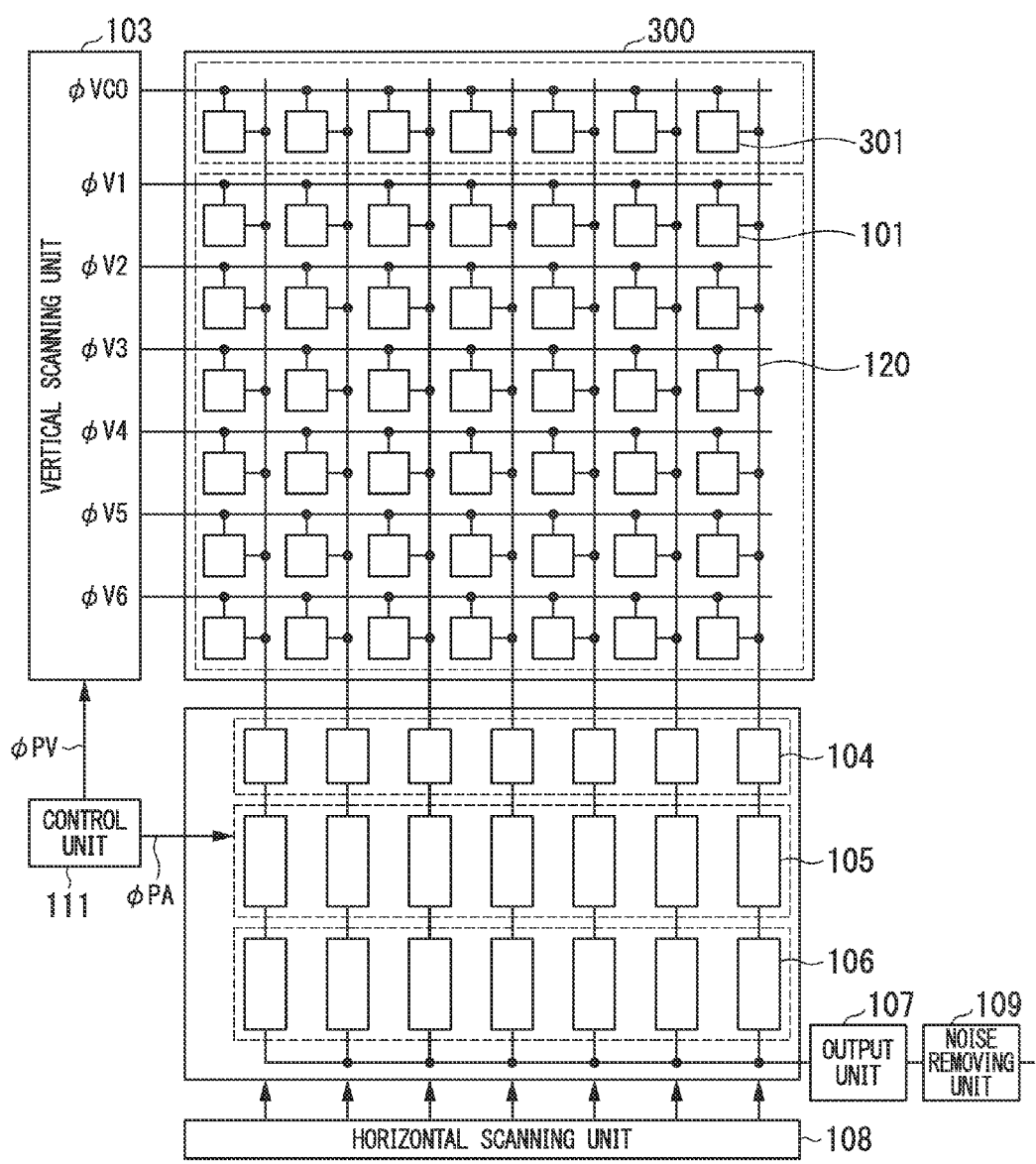
FIG. 6 is a block diagram illustrating the configuration of a solid-state imaging device according to a third embodiment of the present invention.

Next, a third embodiment of the present invention will be described. FIG. 6 is a diagram illustrating the configuration of a solid-state imaging device 3000 according to this embodiment. The same reference numerals are given to constituent elements in FIG. 6 having the same configuration as those in FIG. 1, and the description thereof will not be repeated. Hereinafter, the configuration and operation of the solid-state imaging device according to this embodiment will be described focusing on differences between this embodiment and the first embodiment.

A difference between this embodiment and the first embodiment is that the pixel unit 100 is substituted with a pixel unit 300 and the reference voltage generation unit 110 is excluded. The pixel unit 300 includes a plurality of pixels 101 and a plurality of light-shielding pixels 301 arranged in a matrix form. In this embodiment, the light-shielding pixels 301 corresponding to one row are arranged.

Since incident light is normally shielded in the light-shielding pixels 301, the light-shielding pixels 301 output a dark-state pixel signal (correction pixel signal) at which the incident light does not arrive.

Since the operation of the solid-state imaging device 3000 having the above-described configuration and the operation of the noise removing unit 109 are the same as the operations in the configuration in which the correction pixels 102 of the first embodiment are substituted with the light-shielding pixels 301, the description thereof will not be repeated.

As described above, the solid-state imaging device 3000 according to this embodiment performs the AD conversion on the signals of the light-shielding pixels 301 of one row to remove the low-frequency noise in correspondence with the AD conversion on the pixel signals of the pixels 101 of the plurality of rows and performs the low-frequency noise removing process on the AD conversion results of the pixel signals of the pixels 101 of the plurality of rows based on the AD conversion results of the light-shielding pixels 301 of the signals of one row. Therefore, an increase in the power consumption of the low-frequency noise removing process can be suppressed as much as possible.

In this embodiment, the AD conversion on the signals of the light-shielding pixels 301 of one row is performed to remove the low-frequency noise in correspondence with the AD conversion on the pixel signals of the pixels 101 of the three rows, but the present invention is not limited thereto. The influence of the low-frequency noise may be confirmed in advance and the AD conversion may be performed an optimum number of times in accordance with the degree of influence of the low-frequency noise. In this embodiment, the case in which the number of rows of the light-shielding pixels 301 is one has been described. However, even when the number of rows of the light-shielding pixels 301 is two or more, the same advantage may be obtained.

Fourth Embodiment

Next, a fourth embodiment of the present invention will be described. This embodiment is applicable to the above-described first to third embodiments. Here, a case in which this embodiment is applied to the first embodiment will be exemplified.

Figure 7:
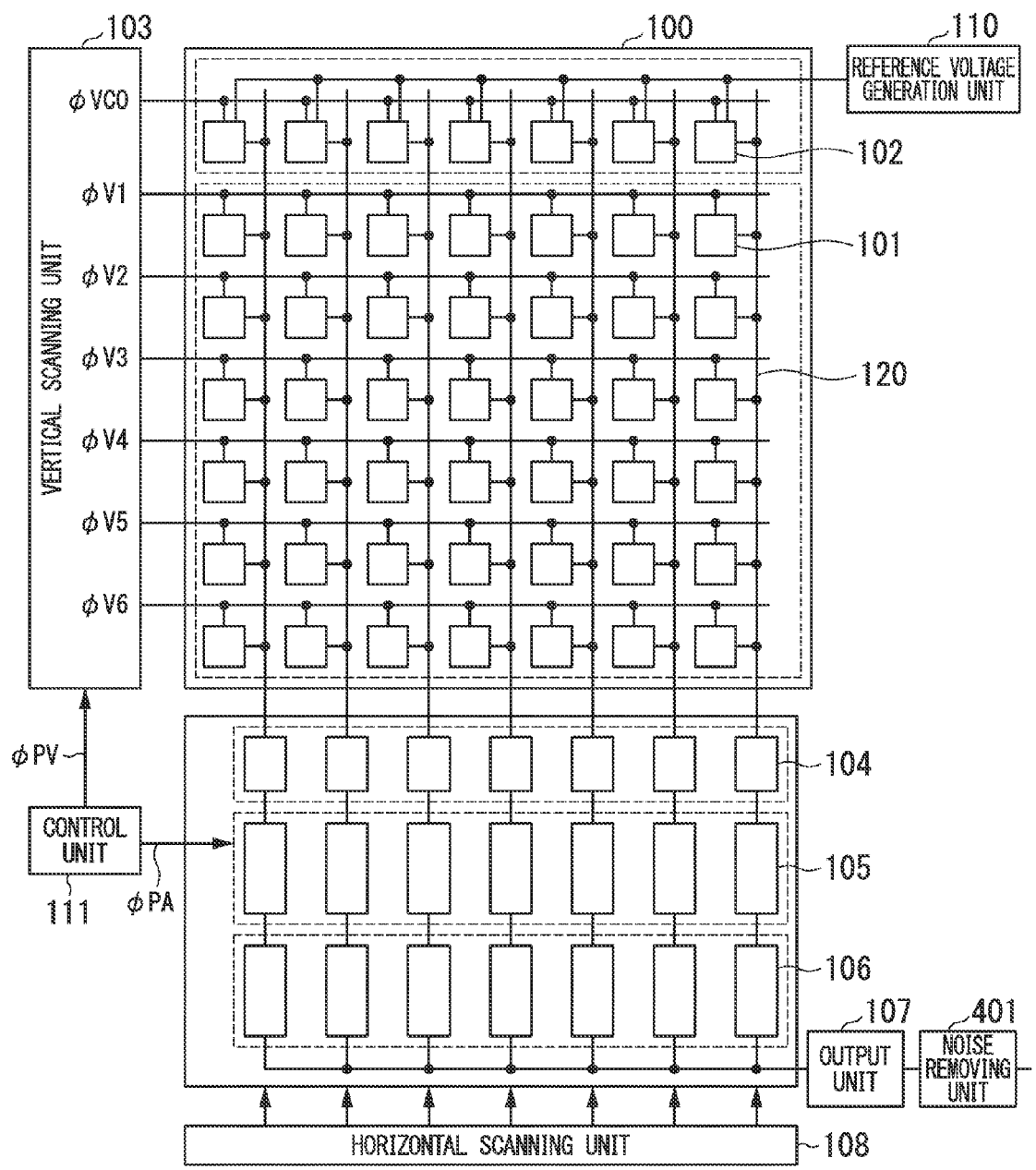
FIG. 7 is a block diagram illustrating the configuration of a solid-state imaging device according to a fourth embodiment of the present invention.

FIG. 7 is a diagram illustrating the configuration of a solid-state imaging device 4000 according to this embodiment. The same reference numerals are given to constituent elements in FIG. 7 having the same configuration as those in FIG. 1, and the description thereof will not be repeated. Hereinafter, the configuration and operation of the solid-state imaging device according to this embodiment will be described focusing on differences between this embodiment and the first embodiment.

Figure 8:
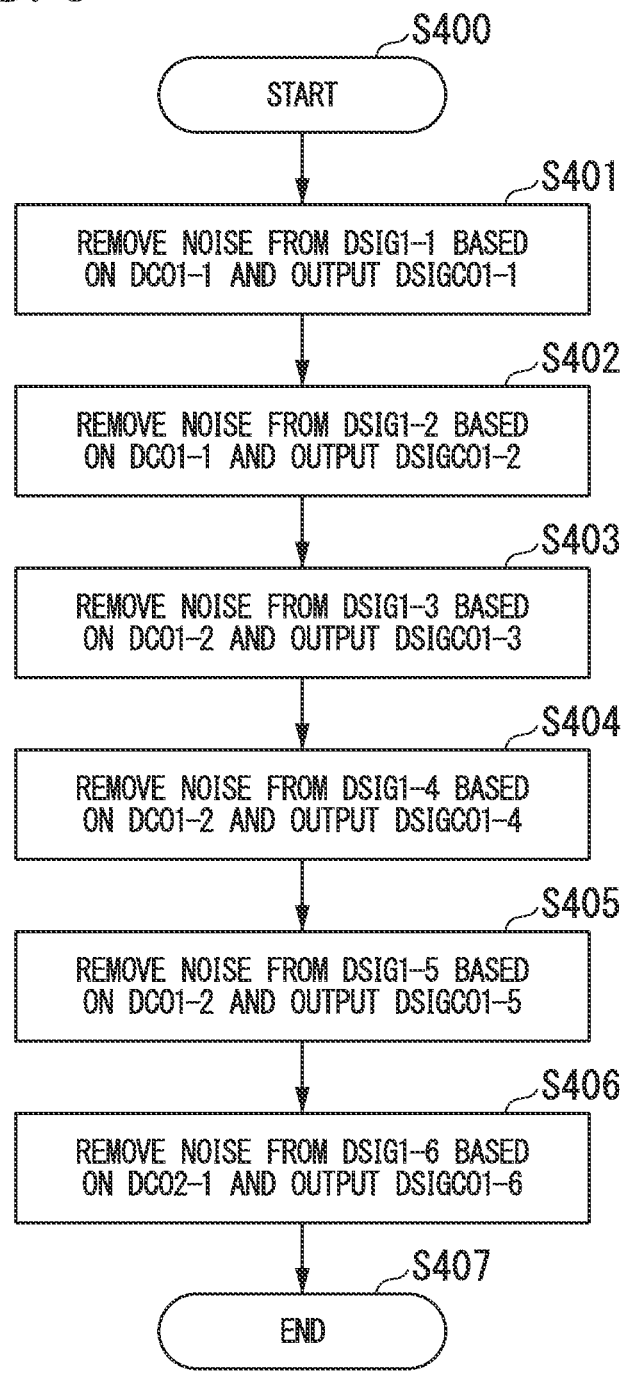
FIG. 8 is a flowchart illustrating an operation of a noise removing unit of the solid-state imaging device according to the fourth embodiment of the present invention.

A difference between this embodiment and the first embodiment is that the noise removing unit 109 is substituted with a noise removing unit 401. Since the operation of the AD conversion circuit 105 is the same as the operation described in the first embodiment (see FIG. 2), the description thereof will not be repeated. Hereinafter, the operation of removing the low-frequency noise of pixel signals DSIG1-1 to DSIG1-6 corresponding to one frame in the noise removing unit 401 will be described with reference to FIG. 8. FIG. 8 is a diagram illustrating the order of a low-frequency noise removing process performed by the noise removing unit 401. Hereinafter, a case in which low-frequency noise of the pixel signals DSIG1-1 to DSIG1-6 corresponding to one frame is removed will be exemplified.

When the AD conversion results are obtained, as in the first embodiment, and the AD conversion results necessary for removing the low-frequency noise are input, the noise removing unit 401 sequentially starts the process (step S400). The noise removing unit 401 performs the low-frequency noise removing process on the AD conversion result DSIG1-1 of the pixel signals of the pixels 101 of the first row based on the AD conversion result DCO1-1 of the signals of the correction pixels 102, and outputs a signal DSIGCO1-1 from which the low-frequency noise is removed (step S401).

Subsequently, the noise removing unit 401 performs the low-frequency noise removing process on the AD conversion result DSIG1-2 of the pixel signals of the pixels 101 of the second row using the AD conversion result DCO1-1 of the signals of the correction pixels 102, and then outputs the signal DSIGCO1-2 from which the low-frequency noise is removed (step S402). Subsequently, the noise removing unit 401 performs the low-frequency noise removing process on the AD conversion result DSIG1-3 of the pixel signals of the pixels 101 of the third row based on the AD conversion result DCO1-2 of the signals of the correction pixels 102, and then outputs the signal DSIGCO1-3 from which the low-frequency noise is removed (step S403).

Subsequently, the noise removing unit 401 performs the low-frequency noise removing process sequentially on the AD conversion result DSIG1-4 of the pixel signals of the pixels 101 of the fourth row and the AD conversion result DSIG1-5 of the pixel signals of the pixels 101 of the fifth row using the AD conversion result DCO1-2 of the signals of the correction pixels 102, and then outputs the signals DSIGCO1-4 and DSIGCO1-5 from which the low-frequency noise is removed (step S404 and step S405). Thereafter, the noise removing unit 401 performs the low-frequency noise removing process sequentially on the AD conversion result DSIG1-6 of the pixel signals of the pixels 101 of the sixth row based on the AD conversion result DCO2-1 of the signals of the correction pixels 102 of the second frame, and then outputs the signals DSIGCO1-6 from which the low-frequency noise is removed (step S406). When the low-frequency noise removing process of the pixel signals of the pixels 101 of all the rows ends, the noise removing unit 401 ends the process (step S407).

As in the first embodiment, the AD conversion is performed on the pixel signals of the pixels 101 of a plurality of rows in correspondence with the AD conversion on the signals of the correction pixels 102 of one row in this embodiment. As shown in FIG. 8, the low-frequency noise removing process is performed on the AD conversion results of the pixel signals of the pixels 101 of the first to third rows using the AD conversion results of the signals of the correction pixels 102 of one row. In particular, in the low-frequency noise removing process using the AD conversion result DCO1-2 of the signals of the correction pixels 102, the low-frequency noise removing process is performed on the AD conversion result DSIG1-3 of the pixel signals of the pixels 101 of one row on which the AD conversion is performed immediately before the AD conversion is performed on the signals of the correction pixels 102 corresponding to the AD conversion result DCO1-2, and is performed on the AD conversion results DSIG1-4 and DSIG1-5 of the pixel signals of the pixels 101 of two rows on which the AD conversion is performed immediately after the AD conversion is performed on the signals of the correction pixels 102 corresponding to the AD conversion result DCO1-2.

As described above, the solid-state imaging device 4000 according to this embodiment performs the AD conversion on the signals of the correction pixels 102 of one row to remove the low-frequency noise in correspondence with the AD conversion on the pixel signals of the pixels 101 of the plurality of rows and performs the low-frequency noise removing process on the AD conversion results of the pixel signals of the pixels 101 of the plurality of rows using the AD conversion results of the signals of the correction pixels 102 of one row. Therefore, an increase in the power consumption of the low-frequency noise removing process may be suppressed as much as possible, compared to a case in which the AD conversion is performed on the signals of the correction pixels of one row whenever the AD conversion is performed on the pixel signals of one row.

The solid-state imaging device 4000 removes the low-frequency noise from the AD conversion results of the pixel signals of the pixels 101 of one row on which the AD conversion is performed immediately before the AD conversion on the signals of the correction pixels 102 and the AD conversion results of the pixel signals of the pixels 101 of two rows on which the AD conversion is performed immediately after the AD conversion on the correction pixels 102 using the AD conversion results of the signals of the correction pixels 102. In the first embodiment, the solid-state imaging device 4000 removes the low-frequency noise from the AD conversion results of the pixel signals of the pixels 101 of three rows subjected to the AD conversion immediately after the AD conversion on the signals of the correction pixels 102 based on the AD conversion results of the signals of the correction pixels 102.

In this embodiment, a time difference between a timing of the AD conversion on the signals of the correction pixels 102 and a timing of the AD conversion on the pixel signals of the pixels 101 to be subjected to the low-frequency noise removing process used the AD conversion results of the signals of the correction pixels 102 is about twice the period t1 in FIG. 2 at a maximum. On the other hand, in the first embodiment, the time difference is about three times the period t1 in FIG. 2 at a maximum. That is, in this embodiment, the low-frequency noise removing process is performed on the AD conversion results of the pixel signals of the pixels 101 subjected to the AD conversion at a timing temporally closer to the timing of the AD conversion on the signals of the correction pixels 102, compared to the first embodiment.

The low-frequency noise depends on a time. Therefore, a correlation increases between the low-frequency noise included in the signals of the correction pixels 102 which the AD conversion is performed at a first timing and the low-frequency noise included in the pixel signals of the pixels 101 which the AD conversion is performed at a second timing, as the time difference between the first timing and the second timing decreases. That is, as the time difference decreases, the low-frequency noise may be removed with higher accuracy.

Accordingly, in this embodiment, the low-frequency noise may be removed with higher accuracy than in the first embodiment.

In this embodiment, the application example of the first embodiment has been described. However, even when the embodiment is applied to the above-described second and third embodiments, the same advantages may be obtained.

Fifth Embodiment

Next, a fifth embodiment of the present invention will be described. The above-described first to fourth embodiments have been described on the assumption that the sampling period of the AD conversion circuit 105 is normally constant. However, when digital data with higher resolution is necessary, it is considered that an operation condition is changed and the sampling period is further lengthened. When the sampling period is further lengthened and a ratio between the number of AD conversions of the signals of the correction pixels and the number of AD conversions of the pixel signals of the pixels in one frame is constant, a time difference between the timing of the AD conversion on the signals of the correction pixels and the timing of the AD conversion on the pixel signals of the pixels to be subjected to the low-frequency noise removing process used the AD conversion result of the signals of the correction pixels is larger. As described in the fourth embodiment, the low-frequency noise may be removed with higher accuracy as the time difference is smaller.

Accordingly, in this embodiment, when the sampling period is further lengthened, the ratio between the number of AD conversions of the pixel signals of the pixels and the number of AD conversions of the signals of the correction pixels in one frame is increased. This embodiment is applicable to the above-described first to fourth embodiments, but a case in which this embodiment is applied to the first embodiment will be exemplified.

Figure 9:
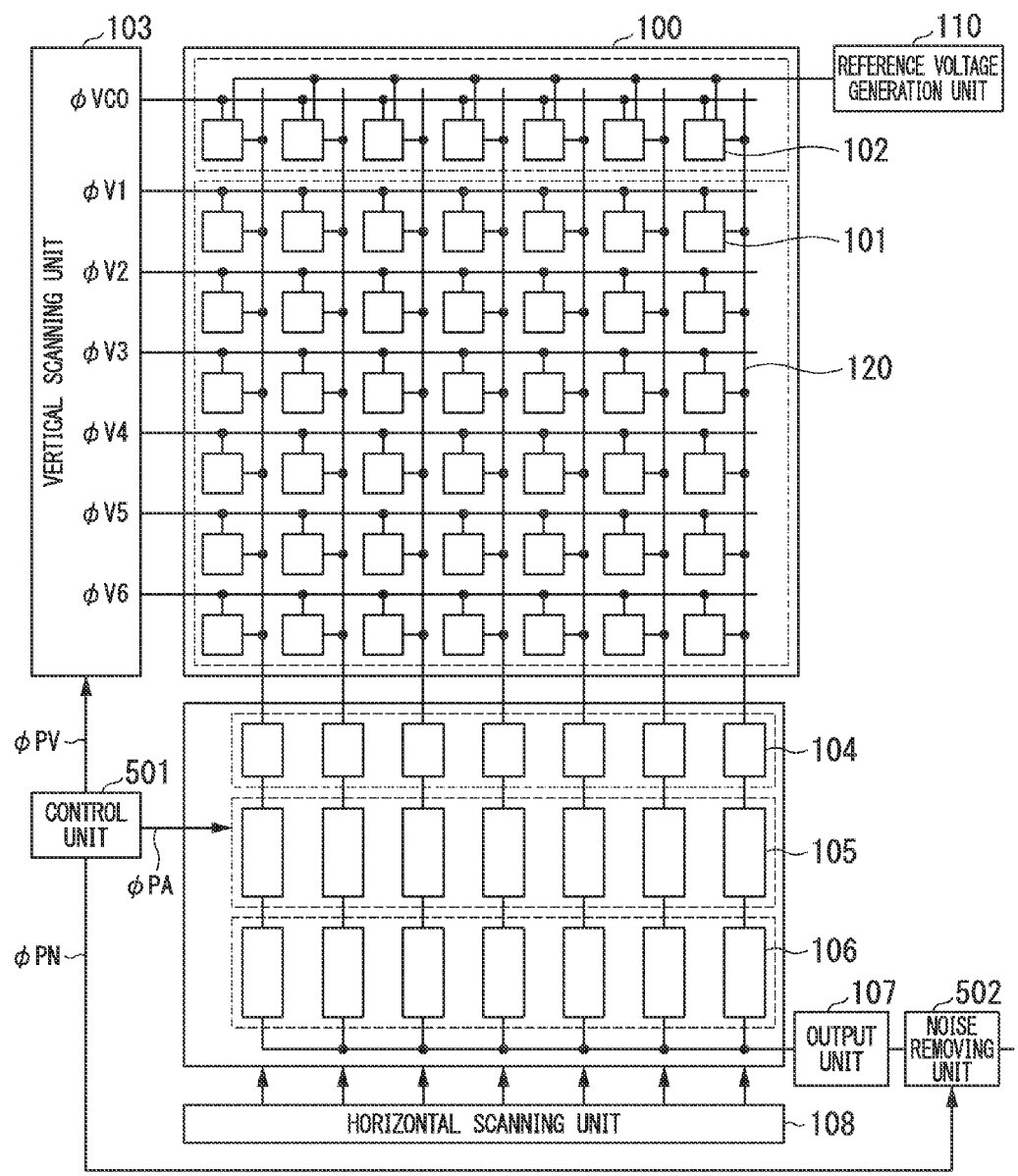
FIG. 9 is a block diagram illustrating the configuration of a solid-state imaging device according to a fifth embodiment of the present invention.

FIG. 9 is a diagram illustrating the configuration of a solid-state imaging device 5000 according to this embodiment. The same reference numerals are given to constituent elements in FIG. 9 having the same configuration as those in FIG. 1, and the description thereof will not be repeated. Hereinafter, the configuration and operation of the solid-state imaging device according to this embodiment will be described focusing on differences between this embodiment and the first embodiment.

A difference between this embodiment and the first embodiment is that the control unit 111 is substituted with a control unit 501, the noise removing unit 109 is substituted with a noise removing unit 502, and the operation of the noise removing unit 502 is controlled by the control unit 501. The control unit 501 outputs control signals to the vertical scanning unit 103, the AD conversion circuit 105, and the noise removing unit 502 to control the operations of the vertical scanning unit 103, the AD conversion circuit 105, and the noise removing unit 502. The control unit 501 controls the vertical scanning unit 103 and the AD conversion circuit 105 using control signals φPV and φPA such that the number of times the pixel signals of the pixels 101 and the signals of the correction pixels 102 are performed on the AD conversion and the sampling period in one frame is changed. The control unit 501 controls the noise removing unit 502 by notifying the noise removing unit 502 of the number of times the pixel signals of the pixels 101 and the signals of the correction pixels 102 are performed on the AD conversion in one frame using a control signal φPN.

Figure 10:
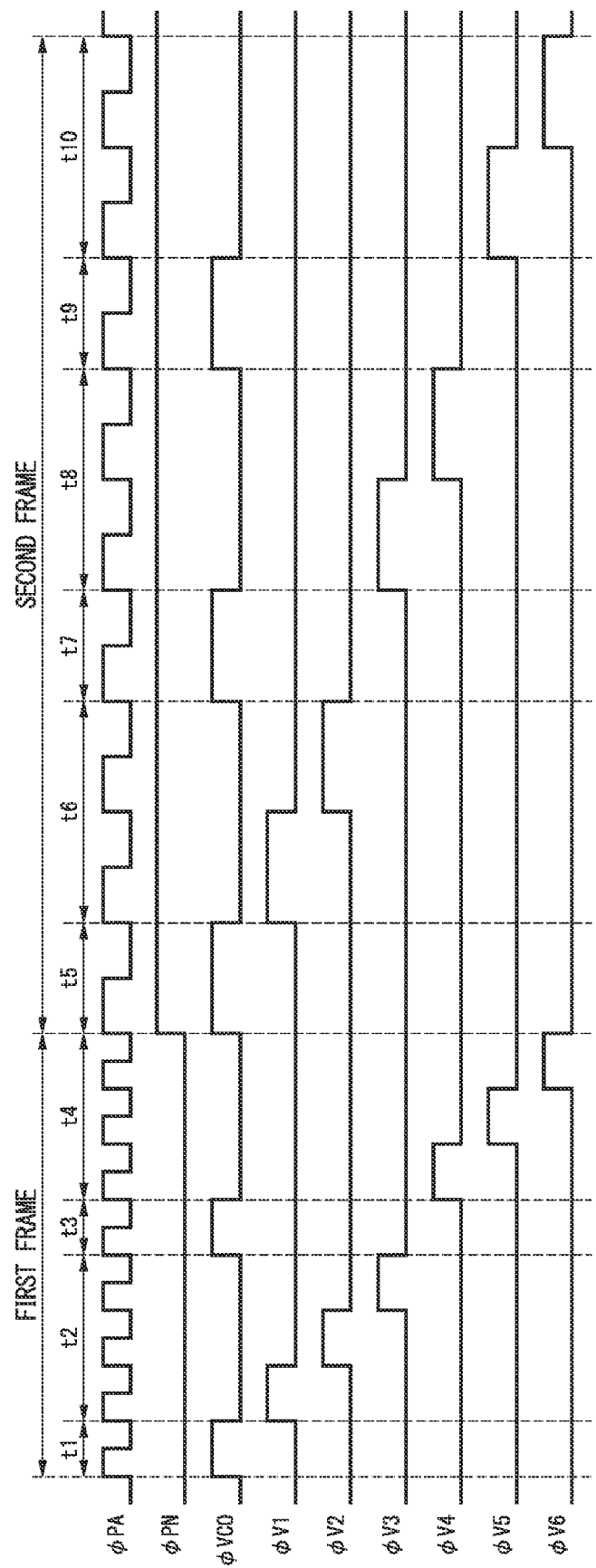
FIG. 10 is a timing chart illustrating an operation of the solid-state imaging device according to the fifth embodiment of the present invention.

Next, the operation of the solid-state imaging device 5000 having the above-described configuration will be described with reference to FIG. 10. FIG. 10 is a diagram illustrating the operation of the solid-state imaging device 5000. First, an operation in the first frame will be described. The operation in the first frame is an operation when the same sampling period as that of the first embodiment is set. During periods t1 to t4, AD conversion results DCO1-1 and DCO1-2 of the signals of the correction pixels 102 and AD conversion results DSIG1-1 to DSIG1-6 of the pixel signals may be obtained in the same operation as that of the first embodiment.

In the first frame, the AD conversion on the pixel signals of the pixels 101 of three rows is performed in correspondence with the AD conversion on the signals of the correction pixel 102 of one row. That is, when the AD conversion on the signals of one row is the AD conversion performed once, the AD conversion on the pixel signals of the pixels 101 is performed three times in correspondence with the AD conversion performed once on the signals of the correction pixels 102. In the first frame, the control signal φPN is in the L state and the noise removing unit 502 removes the low-frequency noise from the AD conversion results of the pixel signals of the pixels 101 of three rows using the AD conversion results of the signals of the correction pixels 102 of one row, as in the first embodiment.

Next, an operation in the second frame will be described. The operation in the second frame is an operation when the sampling period is changed to twice the sampling period of the first frame. In the second frame, the periods of the control signals φPA and φVco are twice the periods of those of the first frame.

First, when the states of the control signals φVco and φPV are changed from the L state to the H state during a period t5 and the signals of the correction pixels 102 are input to the AD conversion circuit 105 via the analog signal processing unit 104, the AD conversion starts. During the AD conversion is performed during the sampling period in which the control signal φPA is in the H state, since the state of the control signal φVco is changed from the H state to the L state, the AD conversion result DCO2-1 of the signals of the correction pixels 102 can be obtained.

Subsequently, the states of the control signals φV1 and φPV are changed from the L state to the H state during a period t6, the pixel signals of the pixels 101 of the first row are subjected to the AD conversion, and an AD conversion result DSIG2-1 can be obtained. Likewise, when the pixel signals of the pixels 101 of the second row are performed on the AD conversion during a period t6, an AD conversion result DSIG2-2 may be obtained. Thereafter, during a period t7, the AD conversion result DCO2-2 of the signals of the correction pixels 102 may be obtained as in the above-described period t5.

Subsequently, when the pixel signals of the pixels 101 of the third and fourth rows are performed on the AD conversion during a period t8, as in the above-described period t6, AD conversion results DSIG2-3 and DSIG2-4 may be obtained. Subsequently, during a period t9, an AD conversion result DCO2-3 of the signals of the correction pixels 102 may be obtained through the same operation as that of the above-described period t5. Subsequently, when the pixel signals of the pixels 101 of the fifth and sixth rows are performed on the AD conversion during a period t10, as in the above-described period t6, AD conversion results DSIG2-5 and DSIG2-6 can be obtained.

In the second frame, the AD conversion on the pixel signals of the pixels 101 is performed twice in correspondence with the AD conversion performed once on the signals of the correction pixels 102. In the second frame, the control signal φPN is in the H state and the noise removing unit 502 removes the low-frequency noise from the AD conversion results of the pixel signals of the pixels 101 of two rows based on the AD conversion results of the signals of the correction pixels 102 of one row.

Figure 11:
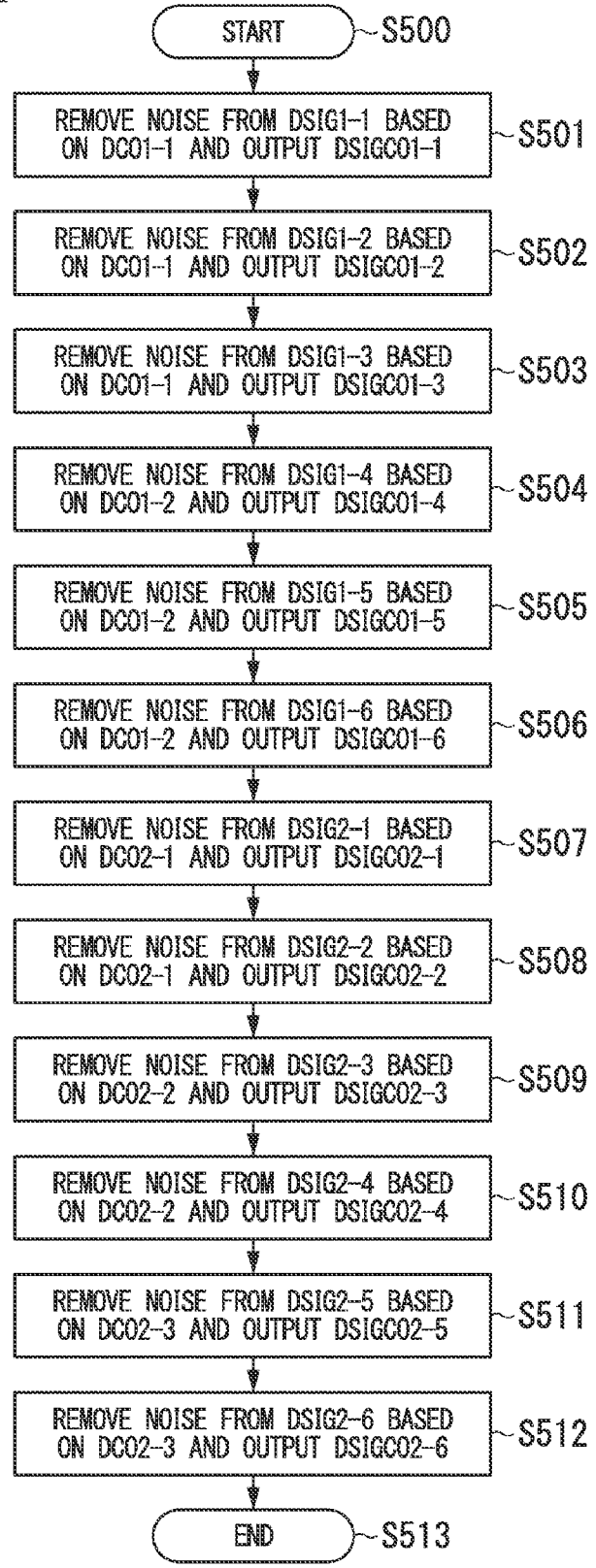
FIG. 11 is a flowchart illustrating an operation of a noise removing unit of the solid-state imaging device according to the fifth embodiment of the present invention.

Next, the operation of the noise removing unit 502 will be described with reference to FIG. 11. FIG. 11 is a diagram illustrating the order of a low-frequency noise removing process performed by the noise removing unit 502. Hereinafter, a case in which low-frequency noise of the pixel signals DSIG1-1 to DSIG1-6 and DSIG2-1 to DSIG2-6 corresponding to two frames is removed will be exemplified.

When the AD conversion results are obtained, as described above, and the AD conversion results necessary for removing the low-frequency noise are input to the noise removing unit 502, the noise removing unit 502 sequentially starts the process (step S500). In the first frame, the noise removing unit 502 performs the noise removing process on the AD conversion results DSIG1-1 to DSIG1-3 of the pixel signals of the pixels 101 of the first to third rows using the AD conversion results DCO1-1 of the signals of the correction pixels 102 under the control signal φPN, and then outputs signals DSIGCO1-1 to DSIGCO1-3 from which the low-frequency noise is removed (step S501 to step S503). Subsequently, the noise removing unit 502 performs the low-frequency noise removing process on the AD conversion results DSIG1-4 to DSIG1-6 of the pixel signals of the pixels 101 of the fourth to sixth rows based on the AD conversion results DCO1-2 of the signals of the correction pixels 102, and then outputs signals DSIGCO1-4 to DSIGCO1-6 from which the low-frequency noise is removed (step S504 to step S506).

Subsequently, in the second frame, the noise removing unit 502 performs the low-frequency noise removing process on the AD conversion results DSIG2-1 and DSIG2-2 of the pixel signals of the pixels 101 of the first and second rows using the AD conversion results DCO2-1 of the signals of the correction pixels 102 under the control signal φPN, and then outputs signals DSIGCO1-1 and DSIGCO1-2 from which the low-frequency noise is removed (step S507 and step S508). Subsequently, the noise removing unit 502 performs the low-frequency noise removing process on the AD conversion results DSIG2-3 and DSIG2-4 of the pixel signals of the pixels 101 of the third and fourth rows based on the AD conversion results DCO2-2 of the signals of the correction pixels 102, and then outputs signals DSIGCO2-3 and DSIGCO2-4 from which the low-frequency noise is removed (step S509 and step S510). Subsequently, the noise removing unit 502 performs the noise removing process on the AD conversion results DSIG2-5 and DSIG2-6 of the pixel signals of the pixels 101 of the fifth and sixth rows using the AD conversion results DCO2-3 of the signals of the correction pixels 102, and then outputs signals DSIGCO2-5 and DSIGCO2-6 from which the low-frequency noise is removed (step S511 and step S512).

As described above, the solid-state imaging device 5000 according to this embodiment performs the AD conversion on the signals of the correction pixels 102 of one row to remove the low-frequency noise in correspondence with the AD conversion of the pixel signals of the pixels 101 of a plurality of rows (in this embodiment, three rows or two rows) and performs the low-frequency noise removing process on the AD conversion results of the pixel signals of the pixels 101 of the plurality of rows using the AD conversion results of the signals of the correction pixels 102 of one row. Therefore, an increase in the power consumption of the low-frequency noise removing process may be suppressed as much as possible, compared to a case in which the AD conversion is performed on the signals of the correction pixels of one row whenever the AD conversion is performed on the pixel signals of one row.

When the sampling period of the AD conversion circuit 105 is changed to be longer, the solid-state imaging device 5000 increases the ratio between the number of AD conversions of the signals of the correction pixels 102 to the number of AD conversions of the pixel signals of the pixels 101 in one frame. Thus, since the low-frequency noise removing process is performed on the AD conversion results of the pixel signals of the pixels 101 subjected to the AD conversion at a timing temporally closer to the timing of the AD conversion on the pixels of the correction pixels 102, the low-frequency noise can be removed with higher accuracy.

In this embodiment, the case in which the sampling period of the AD conversion circuit 105 is lengthened has been described. However, when the sampling period of the AD conversion circuit is shortened, the influence of the low-frequency noise is reduced. Therefore, by further reducing the number of times the signals of the correction pixels 102 are subjected to the AD conversion in one frame, the increase in the power consumption of the low-frequency noise removing process may be suppressed as much as possible.

In this embodiment, the application example of the first embodiment has been described. However, even when the embodiment is applied to the above-described second to fourth embodiments, the same advantages can be obtained.

Sixth Embodiment

Next, a sixth embodiment of the present invention will be described. In the above-described first to fifth embodiments, the description has been made on the assumption that the number of times the signals of the correction pixels are performed on the AD conversion in one frame is common to the AD conversion circuits of the columns. However, the levels of the pixel signals of the pixels are different from each other depending on a subject to the photographed, and thus the degree of low-frequency noise is different for the pixel signals depending on the columns. Accordingly, in this embodiment, the number of times the signals of the correction pixels are performed on the AD conversion in one frame is changed depending on the columns. Since the influence of the low-frequency noise increases in a column in which the level of the pixel signal is high, the low-frequency noise removing process should be performed with higher accuracy. This embodiment may be applicable to the above-described first to fourth embodiments. Here, a case in which this embodiment is applied to the first embodiment will be exemplified.

Figure 12:
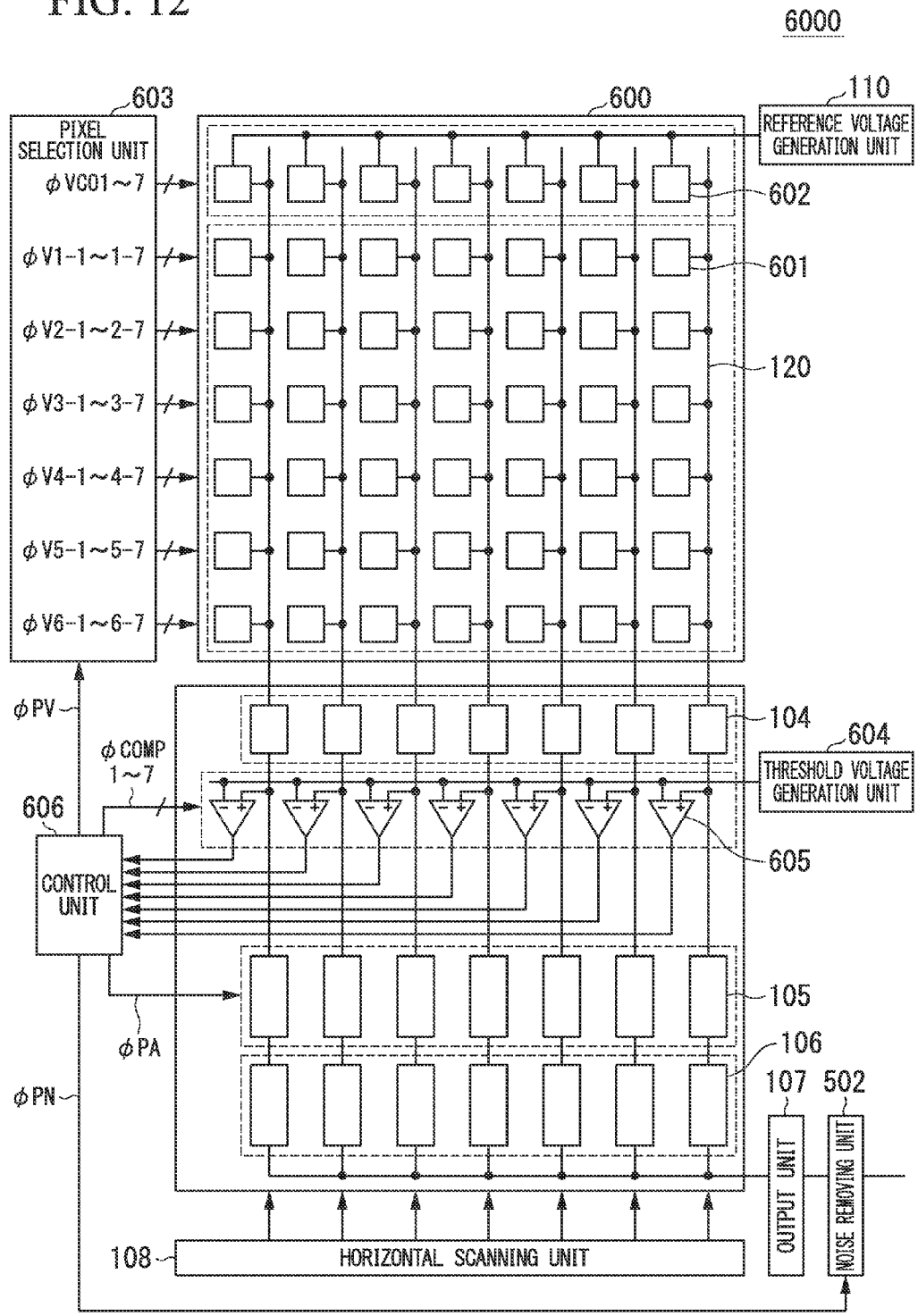
FIG. 12 is a block diagram illustrating the configuration of a solid-state imaging device according to a sixth embodiment of the present invention.

FIG. 12 is a diagram illustrating the configuration of a solid-state imaging device 6000 according to this embodiment. The same reference numerals are given to constituent elements in FIG. 12 having the same configuration as those in FIG. 1, and the description thereof will not be repeated. Hereinafter, the configuration and operation of the solid-state imaging device according to this embodiment will be described focusing on differences between this embodiment and the first embodiment.

A difference between this embodiment and the first embodiment is that the pixel unit 100 is substituted with a pixel unit 600, the vertical scanning unit 103 is substituted with a pixel selection unit 603, the control unit 111 is substituted with a control unit 606, the noise removing unit 109 is substituted with a noise removing unit 502, a threshold voltage generation unit 604 is newly provided, and a comparison unit 605 is newly provided in each column.

The pixel unit 600 includes a plurality of pixels 601 and a plurality of correction pixels 602 arranged in a matrix form. In this embodiment, the correction pixels 602 corresponding to one row are arranged. The pixel selection unit 603 controls an exposure operation and a signal reading operation of the pixels 601, a signal reading operation of the correction pixels 602, or the like by outputting various control signals to the pixel unit 600. The pixel selection unit 603 controls various operations of the pixels 601 and the correction pixels 602 in each row or each column by outputting the control signals in each row or each column. In this embodiment, control signals φVCO1 to φVCO7 are output to the correction pixels 602 of the columns, respectively. Moreover, controls signals φV1-1 to φV1-7 are output to the pixels 601 of the first row located at the columns, respectively. The same applies to the control signals output to the pixels 601 of the second to sixth rows.

The control of the pixels 101 and the correction pixels 102 is performed in units of rows or columns by the above-described control signals. That is, when the signals of the pixels 101 or the correction pixels 102 are read, the pixel selection unit 603 selects a row and a column from which the signals are read, outputs the control signals to the pixels 101 or the correction pixels 102 of the selected row and column, and outputs the signals from the pixels 101 or the correction pixels 102 of the selected row and column to the pixel signal output lines 120. For example, when the control signal φVCO1 enters an H state, the correction pixel 602 at the first column is selected. When the control signal φV1-2 enters an H state, the pixel 601 at the second row and the first column is selected. The pixel selection unit 603 performs an operation suitable for the control signal φPV from the control unit 606 under the control of the control unit 606.

The comparison unit 605 includes a + input terminal and a − input terminal. An output signal of the analog signal processing unit 104 is input to the − input terminal and a threshold voltage Vth (threshold reference voltage) which is an output voltage of the threshold voltage generation unit 604 is input to the + input terminal. The comparison unit 605 is installed in each column. Therefore, the comparison units 605 of the columns compare an output signal (input signal of the AD conversion circuit 105) of the analog signal processing unit 104 to the threshold voltage Vth and output comparison results COUT1 to COUT7 to the control unit 606, respectively. When the output signal (the input signal of the AD conversion circuit 105) of the analog signal processing unit 104 is greater than the threshold voltage Vth, the comparison unit 605 outputs H as the comparison result. When the output signal (the input signal of the AD conversion circuit 105) of the analog signal processing unit 104 is less than the threshold voltage Vth, the comparison unit 605 outputs L as the comparison result.

The operations of the comparison units 605 are controlled by control signals φCOMP1 to φCOMP7 from the control unit 606.

When the control signals φCOMP1 to φCOMP7 are in the H state, the comparison units 605 compare the output signal (the input signal of the AD conversion circuit 105) of the analog signal processing unit 104 to the threshold voltage Vth. When the control signals φCOMP1 to φCOMP7 are in the L state, the comparison units 605 enters a pause state in which the comparison units 605 do not compare the output signal (the input signal of the AD conversion circuit 105) of the analog signal processing unit 104 to the threshold voltage Vth.

The control unit 606 changes the number of times the signals of the correction pixels 602 are subjected to the AD conversion during the period of one frame based on the comparison result of the comparison unit 605, and controls the AD conversion circuit 105, the pixel selection unit 603, the comparison units 605, and the noise removing unit 502 in accordance with the change in the number of times. Specifically, when the comparison unit 605 compares the output signal (the input signal of the AD conversion circuit 105) of the analog signal processing unit 104 to the threshold voltage Vth and the comparison result indicates that the output signal (the input signal of the AD conversion circuit 105) of the analog signal processing unit 104 is greater, the control unit 606 increases the number of times the signals of the correction pixels 602 are performed on the AD conversion during the period of one frame.

The AD conversion circuit 105 of the corresponding column is notified of the number of times the signals of the correction pixels 602 are subjected to the AD conversion during the period of one frame by the control signal φPA, and the AD conversion circuit 105 of the corresponding column changes the operation of the AD conversion. Moreover, the pixel selection unit 603 is notified of the number of times the signals of the correction pixels 602 are performed on the AD conversion during the period of one frame by the control signal φPA, and the pixel selection unit 603 changes the number of times the signals of the correction pixels 602 of the corresponding column are read. When the number of times the signals of the correction pixels 602 are performed on the AD conversion during the period of one frame is changed, the comparison unit 605 of the corresponding column is notified of the number of times by one of the control signals φCOMP1 to φCOMP7, and the comparison unit 605 of the corresponding column pauses the comparison process. The noise removing unit 502 is notified of the number of times the signals of the correction pixels 602 are performed on the AD conversion during the period of one frame by the control signal φPN, and the noise removing unit 502 performs the low-frequency noise removing process in accordance with the control signal φPN.

Figure 13:
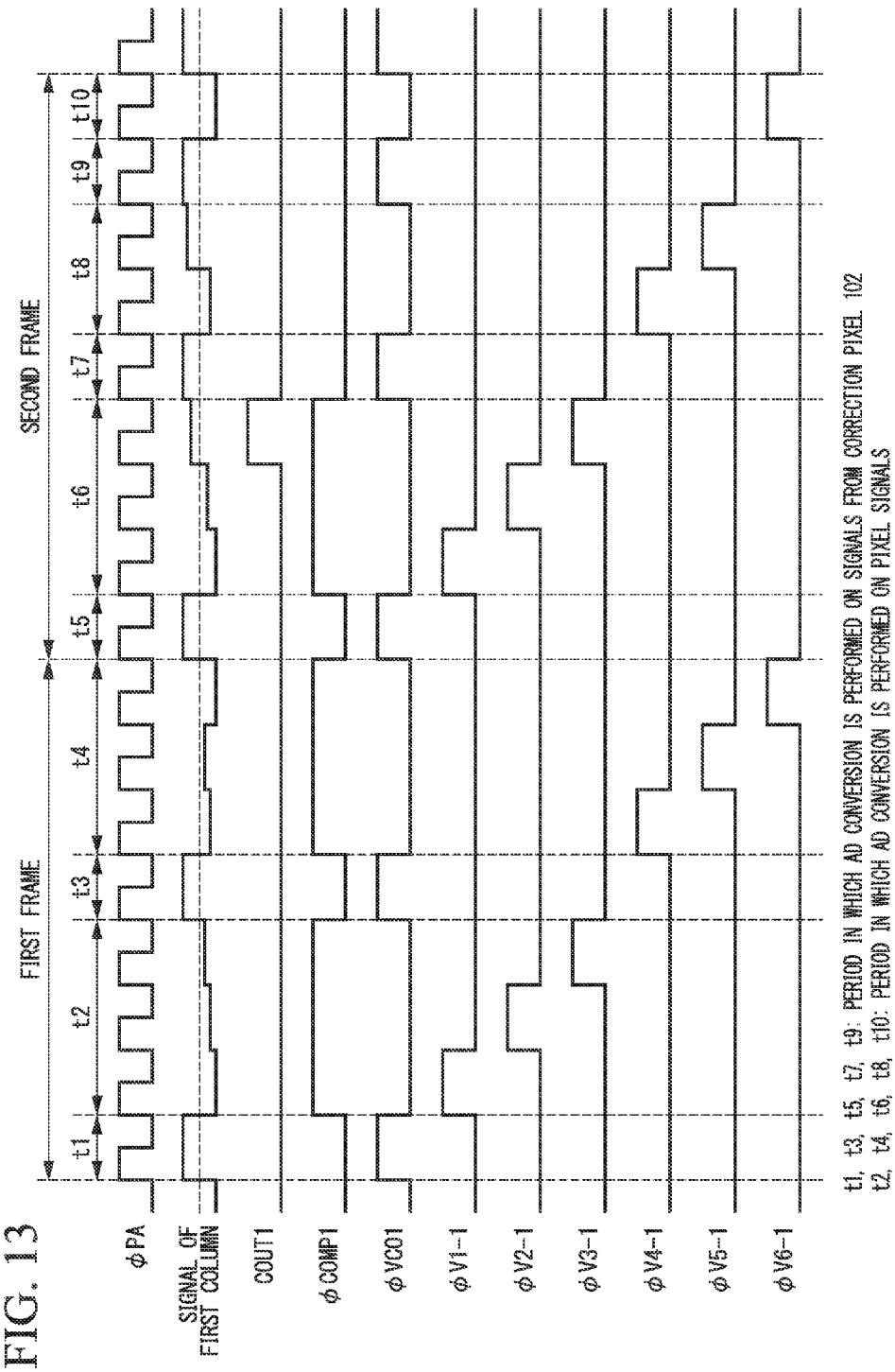
FIG. 13 is a timing chart illustrating an operation of the solid-state imaging device according to the sixth embodiment of the present invention.

Next, the operation of the solid-state imaging device 6000 having the above-described configuration will be described with reference to FIG. 13 focusing on the first column of the pixel unit 600. FIG. 13 is a diagram illustrating the operation of the solid-state imaging device 6000. First, an operation in the first frame will be described. In the first frame, it is assumed that the output signal (the input signal of the AD conversion circuit 105) of the analog signal processing unit 104 is normally less than the threshold voltage Vth when the pixel signals are output from the pixels 601. During a period t1, an AD conversion result DCO1-1 of the signals of the correction pixels 602 may be obtained through the same operation as that of each embodiment described above. At this time, since the control signal φCOMP1 is in the L state, the comparison unit 605 does not compare the signals of the correction pixels 602 to the threshold voltage Vth and the comparison result COUT1 enters the L state.

Subsequently, during a period t2, the pixel signals of the pixels 601 of the first to third rows are performed on the AD conversion. The states of the control signals φV1-1, φV2-1, φV3-1, and φPA are sequentially changed from the L state to the H state, the pixel signals of the pixels 601 of the first to third rows to be subjected to the AD conversion are input to the comparison unit 605 and the AD conversion circuit 105 via the analog signal processing unit 104, and thus the AD conversion results DSIG1-1, DSIG1-2, and DSIG1-3 of the pixel signals may be obtained.

At this time, since the state of the control signal φCOMP1 is changed to the H state, the comparison unit 605 compares the pixel signal to the threshold voltage Vth. In the first frame of FIG. 13, since each pixel signal is less than the threshold voltage Vth, the comparison result COUT1 remains in the L state. Subsequently, during periods t3 and t4, the AD conversion result DCO1-2 of the signals of the correction pixels 602 and the AD conversion results DSIG1-4, DSIG1-5, and DSIG1-6 of the pixel signals may be obtained through the same operation as that of the above-described periods t1 and t2.

Likewise, when the pixel signals are output from the pixels 601 and the output signals of the analog signal processing unit 104 are normally less than the threshold voltage Vth during the period of one frame, the AD conversion is performed once on the signals of the correction pixels 602 in correspondence with the AD conversion performed three times on the pixel signals of the pixels 601.

Next, an operation in the second frame will be described. In the second frame, it is assumed that the output signal of the analog signal processing unit 104 is normally greater than the threshold voltage Vth when the pixel signals are output from the pixels 601. During a period t5, an AD conversion result DCO2-1 of the signals of the correction pixels 602 may be obtained through the same operation as in the above-described period t1.

Subsequently, during a period t6, the pixel signals of the pixels 601 of the first to third rows are performed on the AD conversion and the AD conversion results DSIG2-1, DSIG2-2, and DSIG2-3 can be obtained, as in the above-described period t2. At this time, since the state of the control signal φCOMP1 is changed to the H state, the comparison unit 605 compares the pixel signal to the threshold voltage Vth. In the second frame of FIG. 13, since the pixel signals of the pixels 601 of the third row are greater than the threshold voltage Vth, the comparison result COUT1 remains in the H state. Thus, after a period t7, the control unit 606 increases the number of times the signals of the correction pixels 602 are performed on the AD conversion. Specifically, before the period t7, the AD conversion is performed once on the signals of the correction pixels 602 in correspondence with the AD conversion performed three times on the pixel signals of the pixels 601. However, after the period t7, the AD conversion is performed once on the signals of the correction pixels 602 in correspondence with the AD conversion performed twice on the pixel signals of the pixels 601.

Subsequently, during the period t7, the AD conversion results DCO2-2 of the signals of the correction pixels 602 may be obtained as in the above-described period t1. Subsequently, during a period t8, the pixel signals of the pixels 601 of the fourth and fifth rows are subjected to the AD conversion, and thus the AD conversion results DSIG2-4 and DSIG2-5 of the pixel signals may be obtained. At this time, during the above-described period t6, the number of times the signals of the correction pixels 602 are performed on the AD conversion is already changed. Therefore, after the period t8, the state of the control signal φCOMP1 becomes the L state, and the comparison unit 605 does not compare the pixel signals to the threshold voltage Vth.

Subsequently, during a period t9, the AD conversion result DCO2-3 of the signals of the correction pixels 602 may be obtained through the same operation as that of the above-described period t1. Subsequently, during a period t10, the pixel signals of the pixels 601 of the sixth row may be performed on the AD conversion, and thus the AD conversion result DSIG2-6 of the pixel signals may be obtained.

When the pixel signals output from the pixels 601 and the output signals (the input signals of the AD conversion circuit 105) of the analog signal processing unit 104 are greater than the threshold voltage Vth during the period of one frame, as described above, the number of times the signals of the correction pixels 602 are performed on the AD conversion is changed and the AD conversion is performed once on the signals of the correction pixels 602 in correspondence with the AD conversion performed twice on the pixel signals of the pixels 601.

The noise removing unit 502 performs the low-frequency noise removing process on the AD conversion results of the pixel signals of the pixels 601 using the AD conversion results of the signals of the correction pixels 602 under the control signal φPN from the control unit 606. In the second frame, the noise removing unit 502 is notified by the control signal φPN that the number of times the signals of the correction pixels 602 are performed on the AD conversion is changed. Therefore, the noise removing unit 502 changes a correspondence relation, which is used for the low-frequency noise removing process, between the AD conversion results of the signals of the correction pixels 602 and the AD conversion results of the pixel signals of the pixels 601. Since the operation of the noise removing unit 502 is the same as the above-described operation, the description thereof will not be repeated.

As described above, the solid-state imaging device 6000 according to this embodiment performs the AD conversion on the signals of the correction pixels 602 of one row to remove the low-frequency noise in correspondence with the AD conversion on the pixel signals of the pixels 601 of a plurality of rows (in this embodiment, three or two rows), and performs the low-frequency noise removing process on the AD conversion results of the pixel signals of the pixels 601 of the plurality of rows using the AD conversion results of the signals of the correction pixels 602 of one row. Therefore, an increase in the power consumption of the low-frequency noise removing process may be suppressed as much as possible, compared to a case in which the AD conversion is performed on the signals of the correction pixels of one row whenever the AD conversion is performed on the pixel signals of one row.

When the pixel signals are output from the pixels 601, the output signals (the input signals of the AD conversion circuit 105) of the analog signal processing unit 104 are compared to the threshold voltage Vth and the pixel signal is greater, the solid-state imaging device 6000 increases the ratio between the number of AD conversions of the signals of the correction pixels 602 to the number of AD conversions of the pixel signals of the pixels 601 in one frame. Thus, since the low-frequency noise removing process is performed on the AD conversion results of the pixel signals of the pixels 601 subjected to the AD conversion at a timing temporally closer to the timing of the AD conversion on the pixels of the correction pixels 602, the low-frequency noise can be removed with higher accuracy.

In this embodiment, the case in which the number of times the signal of the correction pixel 602 of a predetermined column is performed on the AD conversion is increased when the pixel signal of the predetermined column is greater than the threshold voltage has been described. However, when the pixel signal of the predetermined column is determined to be greater than the threshold voltage, the number of times the signals of the correction pixels 602 of the predetermined column and right and left columns of the predetermined column are subjected to the AD conversion may be increased. In this case, even when the pixel signals of the right and left columns of the predetermined column are less than the threshold voltage, the number of times the signals of the correction pixels 602 of the right and left columns of the predetermined column are performed on the AD conversion is controlled to be increased.

Since the low-frequency noise also receives interference from the neighboring columns, the interference of a column in which the pixel signals are greater than the threshold voltage also affects the right and left columns of this column. Therefore, in a captured image, vertical stripes may occur at positions corresponding to the right and left columns. However, when the low-frequency noise is likewise removed for the right and left columns by increasing the number of times the signals of the correction pixels 602 are performed on the AD conversion, the low-frequency noise can be removed with high accuracy.

In this embodiment, when the pixel signal is greater than the threshold voltage, that is, the low-frequency noise occurs more easily, the number of times the signal of the correction pixel 602 is subjected to the AD conversion is increased. However, in a manufacturing process or the initial setting process of the solid-state imaging device, the degree of low-frequency noise of each column may be found in advance. Then, in a column easily affected by the low-frequency noise (in which the vertical stripe easily occurs), the number of times the signals of the correction pixels 602 are subjected to the AD conversion may be increased more than the number of times in the other columns.

In this embodiment, the comparison unit 605 is disposed between the analog signal processing unit 104 and the AD conversion circuit 105 and the comparison unit 605 compares the output signal of the analog signal processing unit 104 to the threshold voltage. However, even when the comparison unit 605 is disposed between the pixel unit 600 and the analog signal processing unit 104 and the comparison unit 605 compares the pixel signal to the threshold voltage, the same advantage may be obtained. In this embodiment, the application example of the first embodiment has been described. However, even when the embodiment is applied to the above-described second to fourth embodiments, the same advantages may be obtained.

Seventh Embodiment

Next, a seventh embodiment of the present invention will be described. This embodiment can be applicable to the above-described first to fourth embodiments. Here, a case in which this embodiment is applied to the first embodiment will be exemplified.

Figure 14:
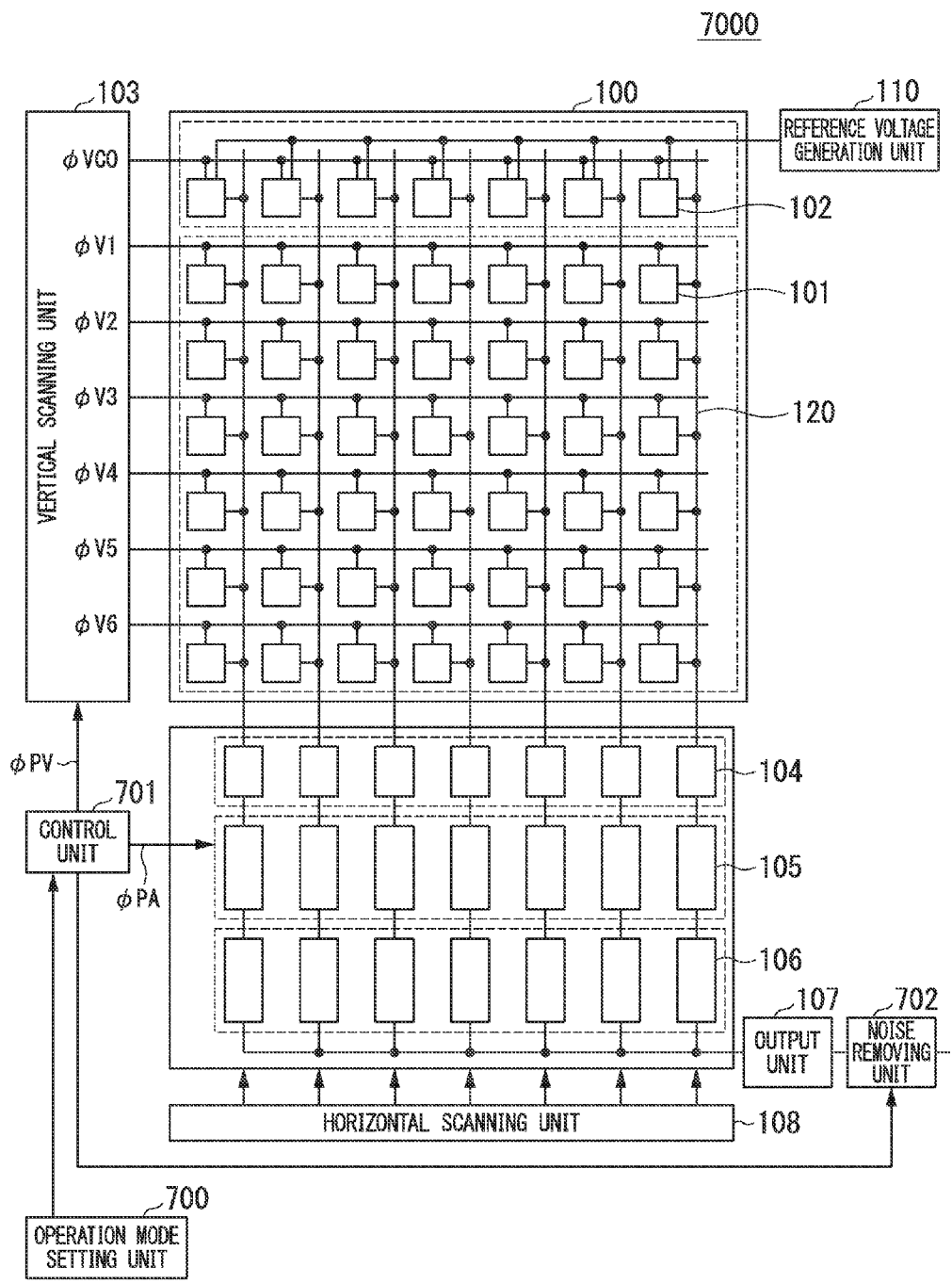
FIG. 14 is a block diagram illustrating the configuration of a solid-state imaging device according to a seventh embodiment of the present invention.
Figure 15:
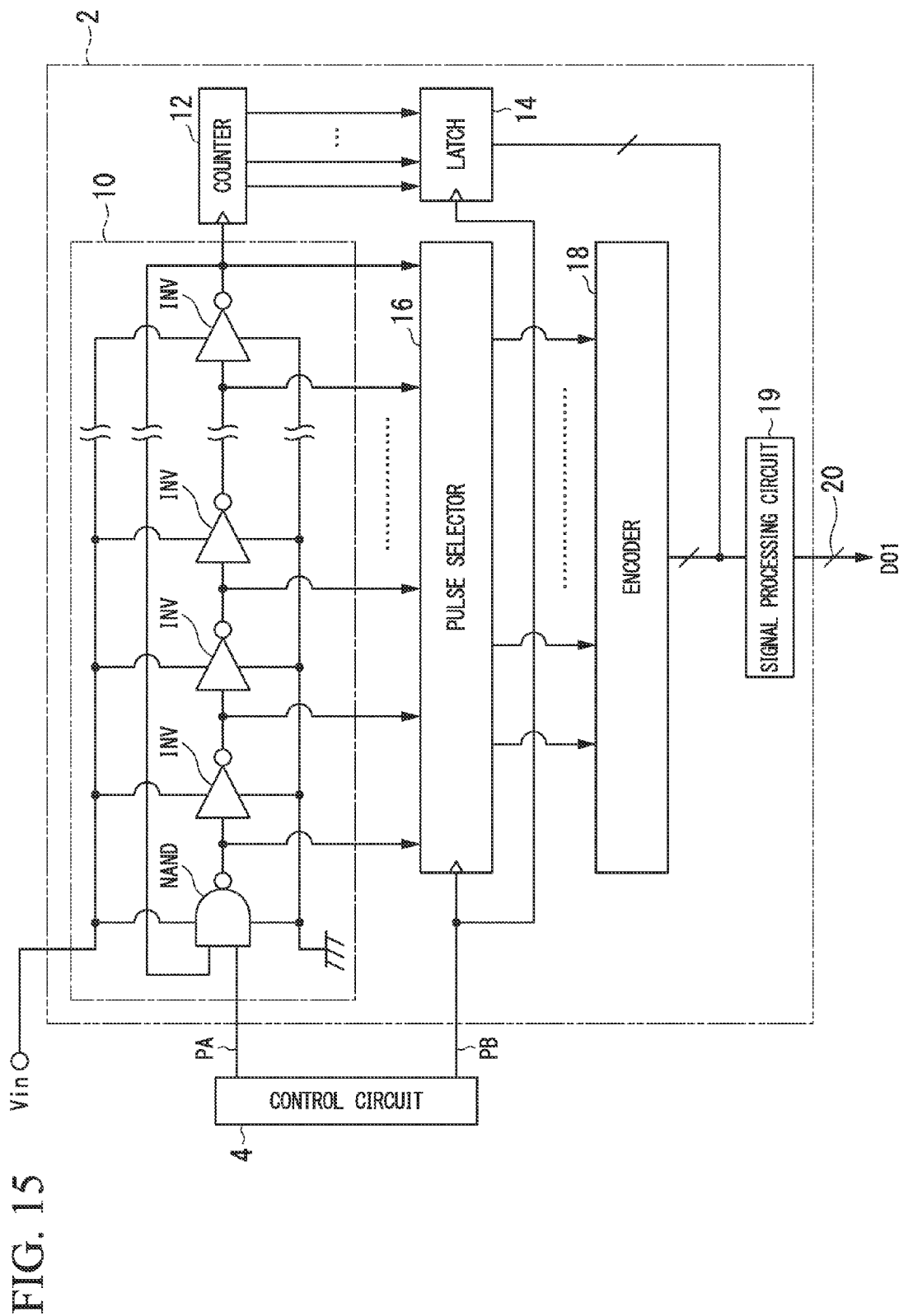
FIG. 15 is a block diagram illustrating the configuration of an AD conversion circuit according to the related art.

FIG. 14 is a diagram illustrating the configuration of a solid-state imaging device 7000 according to this embodiment. The same reference numerals are given to constituent elements in FIG. 14 having the same configuration as those in FIG. 1, and the description thereof will not be repeated. Hereinafter, the configuration and operation of the solid-state imaging device according to this embodiment will be described focusing on differences between this embodiment and the first embodiment.

A difference between this embodiment and the first embodiment is that the control unit 111 is substituted with a control unit 701, the noise removing unit 109 is substituted with a noise removing unit 702, and an operation mode setting unit 700 is newly provided.

The solid-state imaging device 7000 has, as modes of a photographing operation, a high-accuracy mode in which the quality of a captured image is preferred and a power-saving mode in which low-power consumption is preferred. An example of a photographing condition suitable for the high-accuracy mode includes a photographing condition in which a vertical stripe is noticed more easily, such as a condition in which the gain of an image processing unit (not shown) disposed on the rear stage of the solid-state imaging device 7000 is high and a subject having many dark regions is a photographing target. An example of a photographing condition suitable for the power-saving mode includes a photographing condition in which a vertical stripe is scarcely noticed, such as a condition in which the gain of the image processing unit (not shown) is low and a subject having many bright regions is a photographing target.

The operation mode setting unit 700 sets the high-accuracy mode or the power-saving mode described above and outputs a control signal corresponding to the set mode to the control unit 701. The control unit 701 controls the operations of the vertical scanning unit 103, the AD conversion circuit 105, and the noise removing unit 702 in accordance with a control signal from the operation mode setting unit 700, and thus controls the number of times the signals of the correction pixels 102 are performed on the AD conversion. The noise removing unit 702 performs the low-frequency removing process on the pixel signals based on the control signals from the control unit 701.

Next, the operation of the solid-state imaging device 7000 having the above-described configuration will be described. When the operation mode setting unit 700 sets the high-accuracy mode, the operation mode setting unit 700 outputs the control signal corresponding to the high-accuracy mode to the control unit 701. The control unit 701 changes the operations of the vertical scanning unit 103, the AD conversion circuits 105, and the noise removing unit 702 such that the number of times the signals of the correction pixels 102 are subjected to the AD conversion in one frame is increased more than the number of times in the power-saving mode based on the control signal. For example, in the high-accuracy mode, the AD conversion is performed once on the signals of the correction pixels 102 in correspondence with the AD conversion performed twice on the pixel signals of the pixels 101.

In the high-accuracy mode, the number of times the signals of the correction pixels 102 are performed on the AD conversion in one frame is increased more than the number of times in the power-saving mode. Thus, since the low-frequency noise removing process is performed on the AD conversion results of the pixel signals of the pixels 101 performed on the AD conversion at a timing temporally closer to the timing of the AD conversion on the signals of the correction pixels 102, the low-frequency noise may be removed with higher accuracy than in the power-saving mode.

On the other hand, when the operation mode setting unit 700 sets the power-saving mode, the operation mode setting unit 700 outputs a control signal corresponding to the power-saving mode to the control unit 701. Based on this control signal, the control unit 701 changes the operations of the AD conversion circuits 105 and the noise removing unit 702 such that the number of times the signals of the correction pixels 102 are performed on the AD conversion in one frame is decreased more than the number of times in the high-accuracy mode. For example, in the power-saving mode, the AD conversion is performed once on the signals of the correction pixels 102 in correspondence with the AD conversion performed three times on the pixel signals of the pixels 101.

In the power-saving mode, the number of times the signals of the correction pixels 102 are performed on the AD conversion in one frame is decreased more than the number of times in the high-accuracy mode. Thus, the increase in the power consumption of the low-frequency noise removing process may be suppressed as much as possible, compared to the high-accuracy mode.

As described above, the solid-state imaging device 7000 according to this embodiment performs the AD conversion on the signals of the correction pixels 102 of one row to remove the low-frequency noise in correspondence with the AD conversion on the pixel signals of the pixels 101 of a plurality of rows, and performs the low-frequency noise removing process on the AD conversion results of the pixel signals of the pixels 101 of the plurality of rows based on the AD conversion results of the signals of the correction pixels 102 of one row. Therefore, an increase in the power consumption of the low-frequency noise removing process may be suppressed as much as possible, compared to a case in which the AD conversion is performed on the signals of the correction pixels of one row whenever the AD conversion is performed on the pixel signals of one row. Since the number of times the signals of the correction pixels 102 are performed on the AD conversion is changed in accordance with the operation mode, photographing may be performed through an optimum operation corresponding to the operation mode without complicated operation change.

When the operation mode is set, the operation mode may be set based on a user's manual input. Moreover, the operation mode may be determined from information (live-view image) of an image captured beforehand by an imaging device including the solid-state imaging device 7000 according to this embodiment, and the operation mode may be automatically set. In this embodiment, the application example of the first embodiment has been described. However, even when the embodiment is applied to the above-described second to fourth embodiments, the same advantages may be obtained.

The embodiments of the present invention have hitherto been described in detail with reference to the drawings, but the specific configuration is not limited to the above-described embodiments. The present invention also includes design modifications without departing from the gist of the present invention. For example, an application example of the present invention is not limited to the case in which the pixel signal output line of the solid-state imaging device is disposed in each column. Even when the plurality of pixels share one pixel signal output line and the pixel signal output line is disposed in the plurality of columns, the same advantage can be obtained.

The preferable embodiments of the present invention have hitherto been described, but the present invention is not limited to these embodiments. Addition, omission, substitution, other modification of configurations can be made within the scope of the present invention without departing from the gist of the present invention. The present invention is not limited to the above-described configurations and is limited only by the accompanying claims.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A solid-state imaging device comprising:
   a pixel unit that includes a plurality of pixels outputting pixel signals corresponding to an amount of incident light and a plurality of correction pixels outputting correction pixel signals corresponding to a correction reference voltage and is configured such that the plurality of pixels and the plurality of correction pixels are arranged in a matrix form and output the pixel signals or the correction pixel signals to a plurality of pixel signal output lines arranged in correspondence with columns of the matrix;

a vertical scanning unit that selects a row of the matrix and outputs the pixel signals or the correction pixel signals from the pixels or the correction pixels of the selected row to the plurality of pixel signal output lines;

a reference voltage generation unit that outputs the correction reference voltage to the plurality of correction pixels;

an AD conversion unit that includes a delay circuit, which is connected to one of the plurality of pixel signal output lines and to which a plurality of delay elements are connected, and outputs digital signals corresponding to the number of delay elements through which a pulse signal passes when the pulse signal passes through the number of delay elements corresponding to a level of the pixel signal or the correction pixel signal;

a control unit configured to control the vertical scanning unit and the AD conversion unit such that AD conversion is performed on the correction pixel signals of one row followed by AD conversion on the pixel signals of each row of m rows (where m is a natural number greater than or equal to 2) within one frame, the AD conversion on the one row and the m rows being performed sequentially; and a noise removing unit that removes noise from AD conversion results of the pixel signals using AD conversion results of the correction pixel signals.

2. The solid-state imaging device according to claim 1, wherein, based on the AD conversion results of the correction pixel signals of one row, the noise removing unit removes noise from the pixel signals of an r row (where r is a natural number) on which the AD conversion is performed immediately before the AD conversion is performed on the correction pixel signals of the one row and the pixel signals of an s row (where s is a natural number and r+s=m) on which the AD conversion is performed immediately after the AD conversion is performed on the correction pixel signal of the one row.

3. The solid-state imaging device according to claim 1, wherein the control unit controls the vertical scanning unit and the AD conversion unit such that m=j (where j is a natural number greater than or equal to 2) when a length of an AD conversion period of the AD conversion unit is p, and m=i (where i is a natural number greater than or equal to 2) when the length of the AD conversion period of the AD conversion unit is q, wherein, when p is greater than q, i is greater than j, and
wherein, when p is less than q, i is less than j.

4. The solid-state imaging device according to claim 1, wherein the plurality of pixel signal output lines include first and second pixel signal output lines, wherein m=k (where k is a natural number greater than or equal to 2) in the AD conversion unit connected to the first pixel signal output line, wherein m=l (where l is a natural number greater than or equal to 2) in the AD conversion unit connected to the second pixel signal output line, and wherein k is different from l.

5. The solid-state imaging device according to claim 1, further comprising:

a comparison unit that compares an amount of each signal input to the AD conversion unit to an amount of a threshold reference voltage and outputs the comparison result to the control unit, wherein, based on the comparison result, the control unit controls the vertical scanning unit and the AD conversion unit such that m=j (where j is a natural number greater than or equal to 2) when the amount of the signal input to the AD conversion unit is greater than the amount of the threshold reference voltage, and m=i (where i is a natural number greater than or equal to 2) when the amount of the signal input to the AD conversion unit is less than the amount of the threshold reference voltage, and wherein i is greater than j.

6. The solid-state imaging device according to claim 1, further comprising:

a comparison unit that compares an amount of each signal input to the AD conversion unit to an amount of a threshold reference voltage and outputs the comparison result to the control unit, wherein the control unit controls the vertical scanning unit and the AD conversion unit such that m=j (where j is a natural number greater than or equal to 2) in a predetermined column and right and left columns of the predetermined column when the amount of the signal input to the AD conversion unit of the predetermined column is greater than the amount of the threshold reference voltage, and m=i (where i is a natural number greater than or equal to 2) in the predetermined column and right and left columns of the predetermined column when the amount of the signal input to the AD conversion unit of the predetermined column is less than the amount of the threshold reference voltage, and wherein i is greater than j.

7. The solid-state imaging device according to claim 1, further comprising:

an operation mode setting unit that outputs a signal corresponding to an operation mode to the control unit, wherein the control unit controls the vertical scanning unit and the AD conversion unit such that m is changed based on the signal output from the operation mode setting unit.

* * * * *